(12) United States Patent
Liao

(10) Patent No.: US 10,720,509 B1
(45) Date of Patent: Jul. 21, 2020

(54) METHOD FOR PREPARING A SEMICONDUCTOR DEVICE STRUCTURE WITH AN ANNULAR SEMICONDUCTOR FIN

(71) Applicant: NANYA TECHNOLOGY CORPORATION, New Taipei (TW)

(72) Inventor: Chun-Cheng Liao, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/528,295

(22) Filed: Jul. 31, 2019

(51) Int. Cl.
*H01L 29/66* (2006.01)
*H01L 29/06* (2006.01)
*H01L 29/78* (2006.01)

(52) U.S. Cl.
CPC .... *H01L 29/66666* (2013.01); *H01L 29/0657* (2013.01); *H01L 29/66484* (2013.01); *H01L 29/66515* (2013.01); *H01L 29/66545* (2013.01); *H01L 29/66795* (2013.01); *H01L 29/7827* (2013.01)

(58) Field of Classification Search
CPC ......... H01L 29/66484; H01L 29/66666; H01L 29/66787; H01L 29/66795; H01L 29/7827; H01L 29/785; H01L 29/7855; H01L 29/7858; H01L 29/0657; H01L 29/41741
See application file for complete search history.

(56) References Cited

U.S. PATENT DOCUMENTS 5,382,816 A * 1/1995 Mitsui ................ H01L 29/7827
257/266
5,656,842 A * 8/1997 Iwamatsu ............ H01L 27/088
257/329

* cited by examiner

*Primary Examiner* — Robert G Bachner
*Assistant Examiner* — Molly K Reida
(74) *Attorney, Agent, or Firm* — Muncy, Geissler, Olds & Lowe, P.C.

(57) ABSTRACT

The present application discloses a method for preparing a semiconductor device structure. The method includes: forming a ring structure over a substrate; performing an etching process to form an annular semiconductor fin under the ring structure; forming a processed area on a top portion of the substrate exposed by the annular semiconductor fin; selectively forming a spacer on a side surface of the annular semiconductor fin; forming a lower source/drain region on the surface of the substrate in contact with a bottom portion of the annular semiconductor fin; forming an inner gate structure in contact with an inner sidewall of the annular semiconductor fin and forming an outer gate structure in contact with an outer sidewall of the annular semiconductor fin; and forming an upper source/drain region on an upper portion of the annular semiconductor fin.

15 Claims, 15 Drawing Sheets

METHOD FOR PREPARING A SEMICONDUCTOR DEVICE STRUCTURE WITH AN ANNULAR SEMICONDUCTOR FIN

TECHNICAL FIELD

The present disclosure relates to a method for preparing a semiconductor device structure, and more particularly, to a method for preparing a vertical field effect transistor structure with an annular semiconductor fin.

DISCUSSION OF THE BACKGROUND

As semiconductor device structures become smaller and more highly integrated, a number of technologies for fabricating fine patterns for semiconductor device structures have been developed. Particularly, a photolithography process is typically used to fabricate electronic and optoelectronic devices on a substrate, and photoresist patterns prepared by the photolithography process are used as masks in etching or ion implantation processes. As the required pitch size and critical dimension (CD) continue to shrink, the fineness of the photoresist patterns becomes a very important factor in the degree of integration. However, photolithographic processes for fabricating semiconductor features present a limitation to continued increases in resolution of the exposure apparatus.

Although existing semiconductor device structures with fine patterns and methods for manufacturing the same have been adequate for their intended purposes, they have not been entirely satisfactory in all respects. Therefore, at the present time, there are still some problems to be overcome in regards to the technologies of forming semiconductor device structures with fine patterns by photolithography process.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In some embodiments of the present disclosure, a method for preparing a semiconductor device structure is provided. The method includes: forming a ring structure over a substrate; performing an etching process to form an annular semiconductor fin under the ring structure; forming a processed area on a top portion of the substrate exposed by the annular semiconductor fin; selectively forming a spacer on a side surface of the annular semiconductor fin; forming a lower source/drain region on the surface of the substrate in contact with a bottom portion of the annular semiconductor fin; forming an inner gate structure in contact with an inner sidewall of the annular semiconductor fin and forming an outer gate structure in contact with an outer sidewall of the annular semiconductor fin; and forming an upper source/drain region on an upper portion of the annular semiconductor fin.

In some embodiments, the method further comprises: forming a pillar over the substrate; forming the ring structure surrounding the pillar, wherein a width of the pillar is greater than a width of the ring structure; and removing the pillar after the ring structure is formed.

The method for preparing a semiconductor device structure of claim 1, where in the width of the pillar is greater than about three times a width of the ring structure.

In some embodiments, the method further comprises: forming a mask layer having an aperture exposing a portion of the annular semiconductor fin; and performing an etching process to remove a portion of the annular semiconductor fin exposed by the aperture.

In some embodiments, the aperture exposes a portion of the inner gate structure and a portion of the outer gate structure, and the etching process removes a portion of the inner gate structure and a portion of the outer gate structure.

In some embodiments, the method further comprises: forming a sacrificial epitaxial semiconductor layer on top of the lower source/drain region, wherein the lower source/drain region is formed of a first type of epitaxial semiconductor material, and the sacrificial epitaxial semiconductor layer is formed of a second type of epitaxial semiconductor material which is different from the first type of epitaxial semiconductor material.

In some embodiments, the method further comprises: selectively oxidizing the sacrificial epitaxial semiconductor layer to form a self-aligned bottom insulating spacer comprising an oxide layer.

In some embodiments, the self-aligned bottom insulating spacer electrically insulates the gate structure from the lower source/drain region.

In some embodiments, the step of forming a processed area comprises performing an ion implantation process.

In some embodiments, the ion implantation damages the top portion of the substrate exposed by the annular semiconductor fin.

In some embodiments, the step of forming a processed area comprises performing an ion implantation process to form an inner processes area inside the annular semiconductor fin and an outer processes area outside annular semiconductor fin.

In some embodiments, the annular semiconductor fin comprises silicon, and the step of forming the spacer comprises performing a thermal oxidation process.

In some embodiments, the annular semiconductor fin comprises silicon, and the step of forming the spacer comprises performing a thermal oxidation process to form an inner spacer on an inner side surface of the annular semiconductor fin and an outer spacer on an outer side surface of the annular semiconductor fin.

In some embodiments, the method further comprises: performing a recess process to remove the processed area from the top portion of the substrate.

In some embodiments, the recess process is performed using a directional anisotropic dry etch process, which is configured to vertically etch the processed area.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
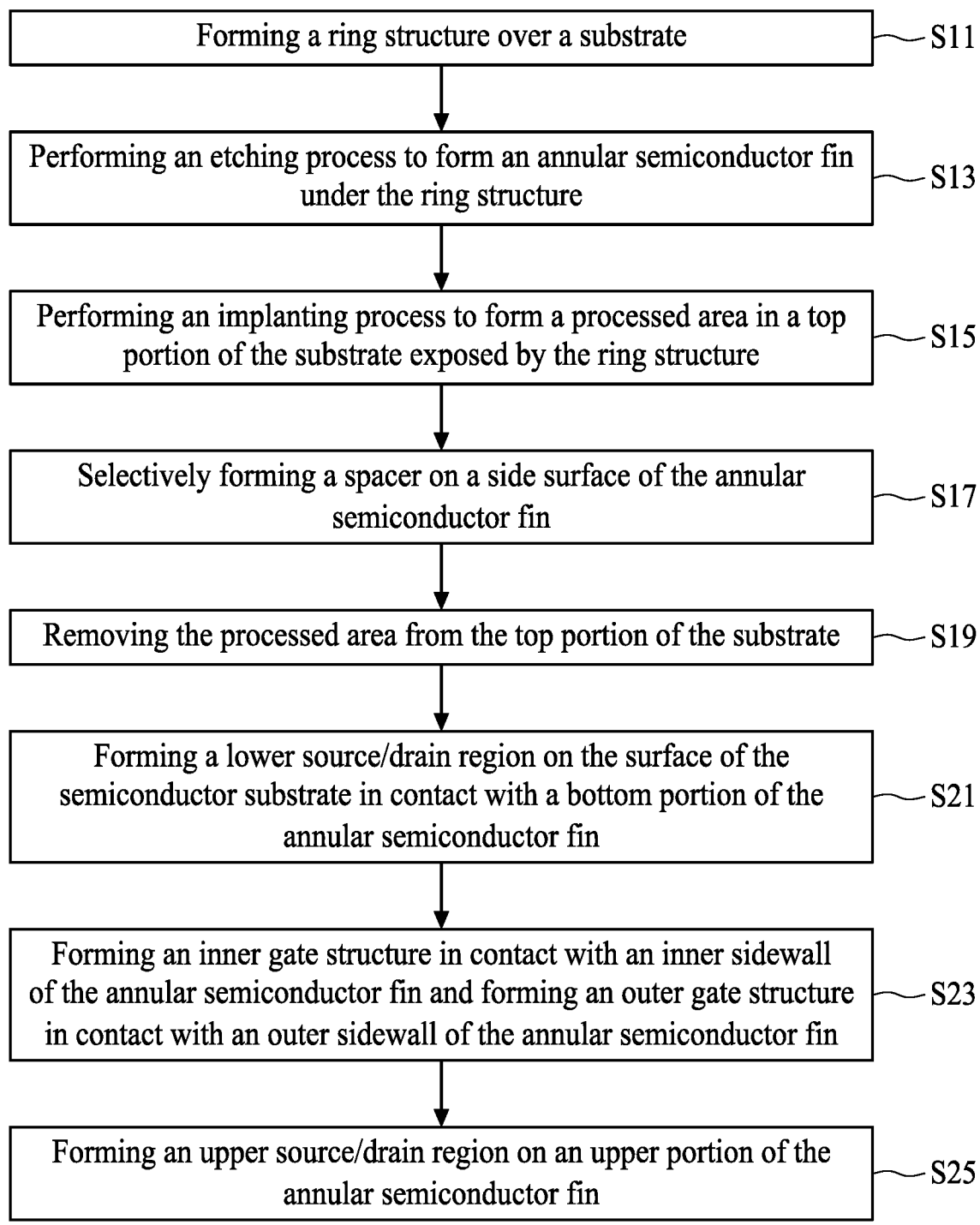
FIG. 1 is a flow diagram illustrating a method of preparing a semiconductor device structure (vertical field effect transistor structure), in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow diagram illustrating a method 10 for preparing a vertical field effect transistor structure, in accordance with some embodiments. The method 10 includes steps S11, S13, S15, S17, S19, S21, S23 and S25.

The steps S11 to S25 of FIG. 1 are first introduced briefly and then elaborated in connection with FIGS. 2 to 20. At step S11, a ring structure is formed over a substrate. In some embodiments, more than one pillar is formed over the substrate, and each ring structure is separated by a distance. At step S13, an etching process is performed to form an annular semiconductor fin under the ring structure. At step S15, an ion implanting process is performed to form a processed area in a top portion of the substrate exposed by the ring structure. At step S17, a spacer is selectively on a side surface of the annular semiconductor fin. At step S19, the processed area is removed from the top portion of the substrate.

Still referring to FIG. 1, at step S21, a lower source/drain region is formed on the surface of the substrate in contact with a bottom portion of the annular semiconductor fin. At step S23, an inner gate structure is formed in contact with an inner sidewall of the annular semiconductor fin and an outer gate structure is formed in contact with an outer sidewall of the annular semiconductor fin. At step S25, an upper source/drain region is formed on an upper portion of the annular semiconductor fin.

Figure 2:
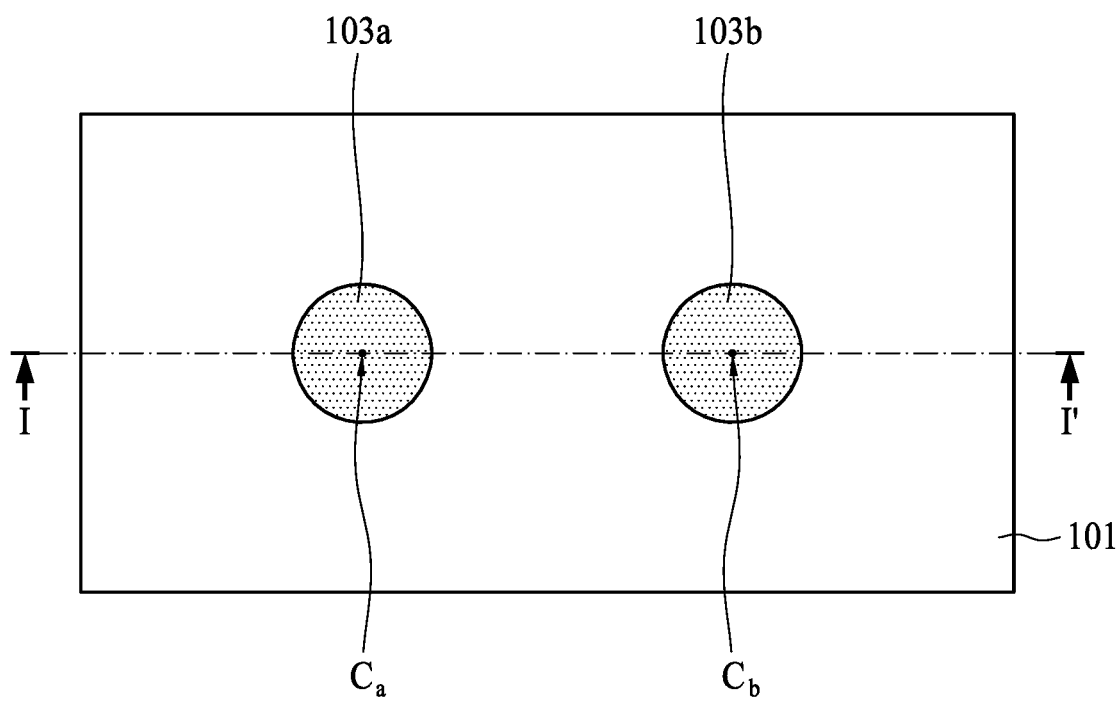
FIG. 2 is a top view illustrating an intermediate stage of preparing a semiconductor device structure, in accordance with some embodiments.
Figure 3:
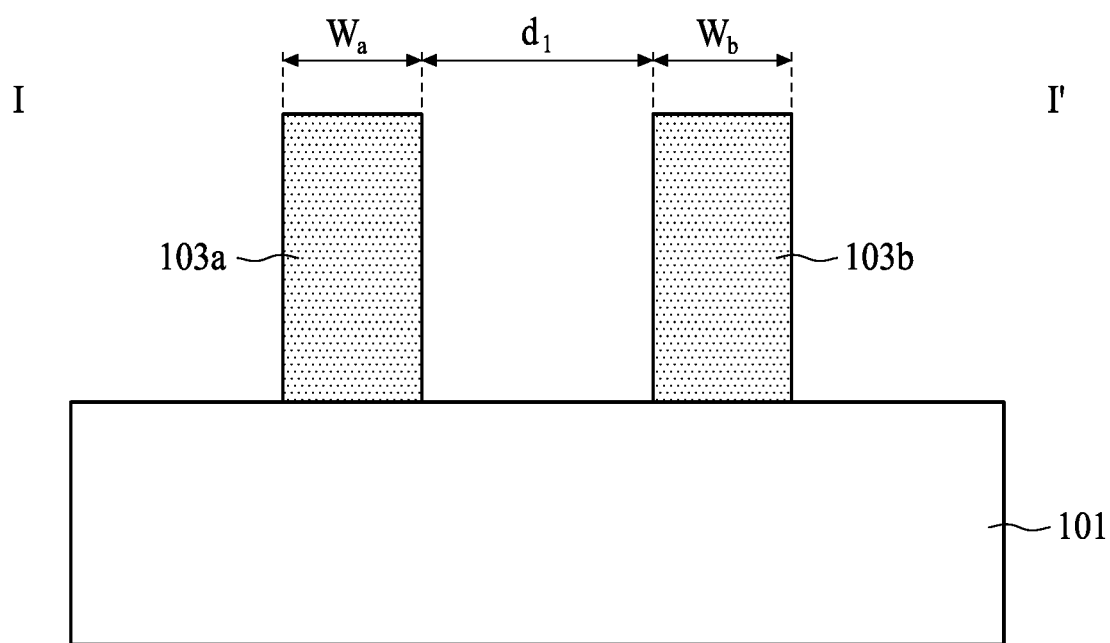
FIG. 3 is a cross-sectional view illustrating an intermediate stage of preparing a semiconductor device structure, taken along a sectional line I-I' in FIG. 2, in accordance with some embodiments.

FIG. 2 is a top view illustrating an intermediate stage of preparing a semiconductor device structure (a vertical field effect transistor) 100, in accordance with some embodiments. FIG. 3 is a cross-sectional view illustrating an intermediate stage of forming the semiconductor device structure 100, taken along a sectional line I-I' in FIG. 2, in accordance with some embodiments.

As shown in FIGS. 2 and 3, pillars 103a and 103b are formed over a substrate 101. In some embodiments, the pillars 103a and 103b are circular in the top view of FIG. 2, wherein the pillar 103a has a center $C_a$, and the pillar 103b has a center $C_b$. The cross-sectional view of FIG. 3 is along the sectional line I-I' of FIG. 2, and the sectional line I-I' passes through the centers $C_a$ and $C_b$. Moreover, the pillar 103a has a width $W_a$, the pillar 103b has a width $W_b$, and the pillar 103a and the pillar 103b are separated by a distance $d_1$, as shown in FIG. 3 in accordance with some embodiments.

In some embodiments, the substrate 101 is made of silicon. Alternatively, the substrate 101 may include other elementary semiconductor materials such as germanium (Ge). In some embodiments, the substrate 101 is made of a compound semiconductor such as silicon carbide, gallium nitride, gallium arsenic, indium arsenide, or indium phosphide. In some embodiments, the substrate 101 is made of an alloy semiconductor such as silicon germanium, silicon germanium carbide, gallium arsenic phosphide, or gallium indium phosphide. In some embodiments, the substrate 101 includes a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some embodiments, the substrate 101 includes various material layers (e.g., dielectric layers, semiconductor layers, and/or conductive layers) configured to form integrated circuit (IC) features (e.g., doped regions/features, isolation features, gate features, source/drain features (including epitaxial source/drain features), interconnect features, other features, or combinations thereof).

Moreover, the pillars 103a and 103b are made of dielectric materials, in accordance with some embodiments. In some embodiments, the pillars 103a and 103b include silicon oxide, silicon nitride, silicon carbide, silicon oxynitride, silicon oxycarbide (SiOC), silicon carbonitride (SiCN), silicon oxide carbonitride (SiOCN), another applicable material, or a combination thereof In addition, the pillars 103a and 103b are formed by a deposition process and a patterning process. For example, a material layer (not shown) may be deposited over the substrate 101, and the material layer may be patterned to form pillars 103a and 103b over the substrate 101. The deposition process may include a chemical vapor deposition (CVD) process, a physical vapor deposition (PVD) process, an atomic layer deposition (ALD) process, a spin-on process, another applicable process, or a combination thereof In some embodiments, the patterning process includes a photolithography process and a subsequent etching process. The photolithography process may form photo resist patterns (not shown) on a top surface of the material layer. The photolithography process may include photoresist coating (e.g., spin coating), soft baking, mask aligning, exposure, post-exposure baking, developing the photoresist, rinsing and drying (e.g., hard baking). In some embodiments, the etching process is a dry etching process, a wet etching process, or a combination thereof It should be noted that the width $W_a$ is substantially the same as the width $W_b$, and the proportion of the width $W_a$ to the distance $d_1$ is approximately three to five, in accordance with some embodiments. Within the context of this disclosure, the word "substantially" means preferably at least 90%, more preferably 95%, even more preferably 98%, and most preferably 99%. In addition, although the pillars 103a and 103b are circular in the top view of FIG. 2, the scope of the disclosure is not intended to be limiting. For example, in other embodiments, the pillars 103a and 103b may have other shapes in the top view.

Figure 4:
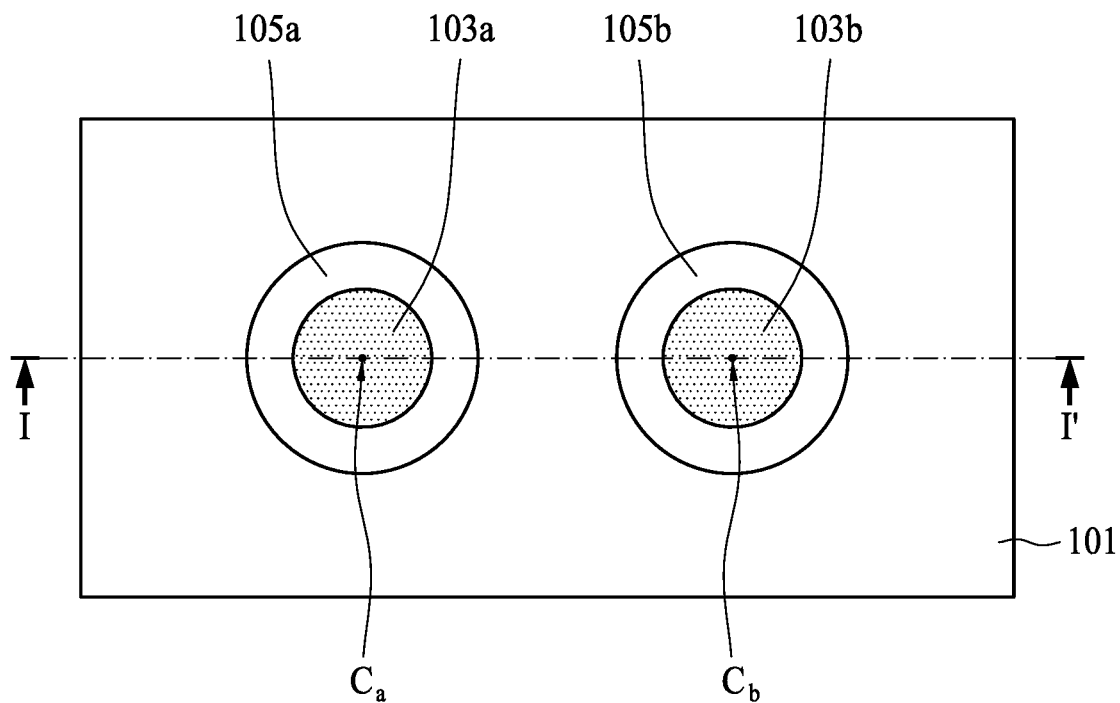
FIG. 4 is a top view illustrating an intermediate stage of preparing a semiconductor device structure, in accordance with some embodiments.
Figure 5:
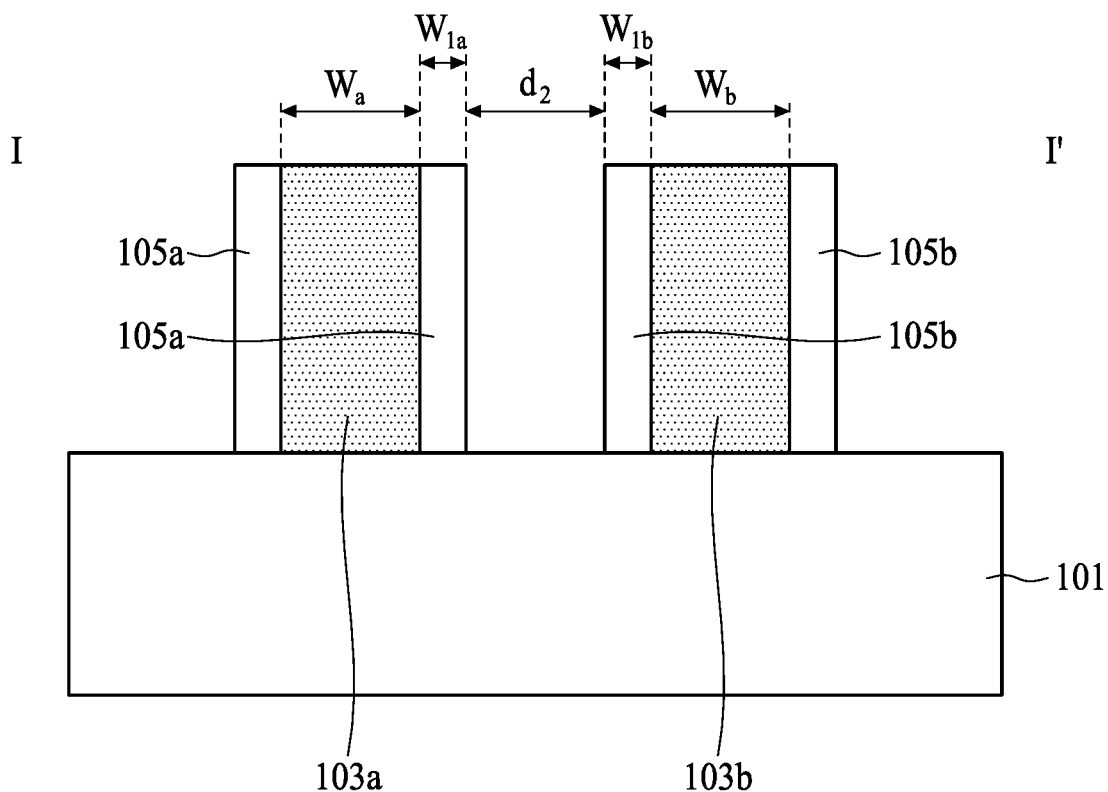
FIG. 5 is a cross-sectional view illustrating an intermediate stage of preparing a semiconductor device structure, taken along a sectional line I-I' in FIG. 4, in accordance with some embodiments.

FIG. 4 is a top view illustrating an intermediate stage of forming the semiconductor device structure 100, in accordance with some embodiments. FIG. 5 is a cross-sectional view illustrating an intermediate stage of forming the semiconductor device structure 100, taken along a sectional line I-I' in FIG. 4, in accordance with some embodiments.

As shown in FIGS. 4 and 5, ring structures 105a and 105b are formed surrounding the pillars 103a and 103b. More specifically, sidewalls of the pillar 103a are entirely surrounded and in direct contact with the ring structure 105a, and sidewalls of the pillar 103b are entirely surrounded and in direct contact with the ring structure 105b, in accordance with some embodiments. In other words, sidewalls of the pillar 103a have no portion not covered by the ring structure 105a, and sidewalls of the pillar 103b have no portion not covered by the ring structure 105b.

Some materials and processes used to form the ring structures 105a and 105b are similar to those used to form the pillars 103a and 103b, and descriptions thereof are not repeated herein. However, it should be noted that the materials of the pillars 103a and 103b are different from the materials of the ring structures 105a and 105b. In some embodiments, The ring structures 105a and 105b can be formed (e.g., deposited) using a number of methods, such as: chemical vapor deposition using $O_3$ and TEOS to form silicon oxide, atomic layer deposition using a silicon precursor with an oxygen or nitrogen precursor to form silicon oxides and nitrides. The ring structures 105a and 105b can be formed using a method such as a reactive ion etch (ME) process selectively stopping at a dielectric anti-reflective coating (DARC) layer (not shown).

The ring structure 105a has a width $W_{1a}$, the ring structure 105b has a width $W_{1b}$, and the ring structure 105a and the ring structure 105b are separated a distance $d_2$, as shown in FIG. 5 in accordance with some embodiments. In some embodiments, the width $W_{1a}$ is substantially the same as the width $W_{1b}$, the distance $d_2$ is substantially the same as the width $W_a$, and the proportion of the width $W_{1a}$ to the distance $d_2$ is approximately one to three, in accordance with some embodiments.

Figure 6:
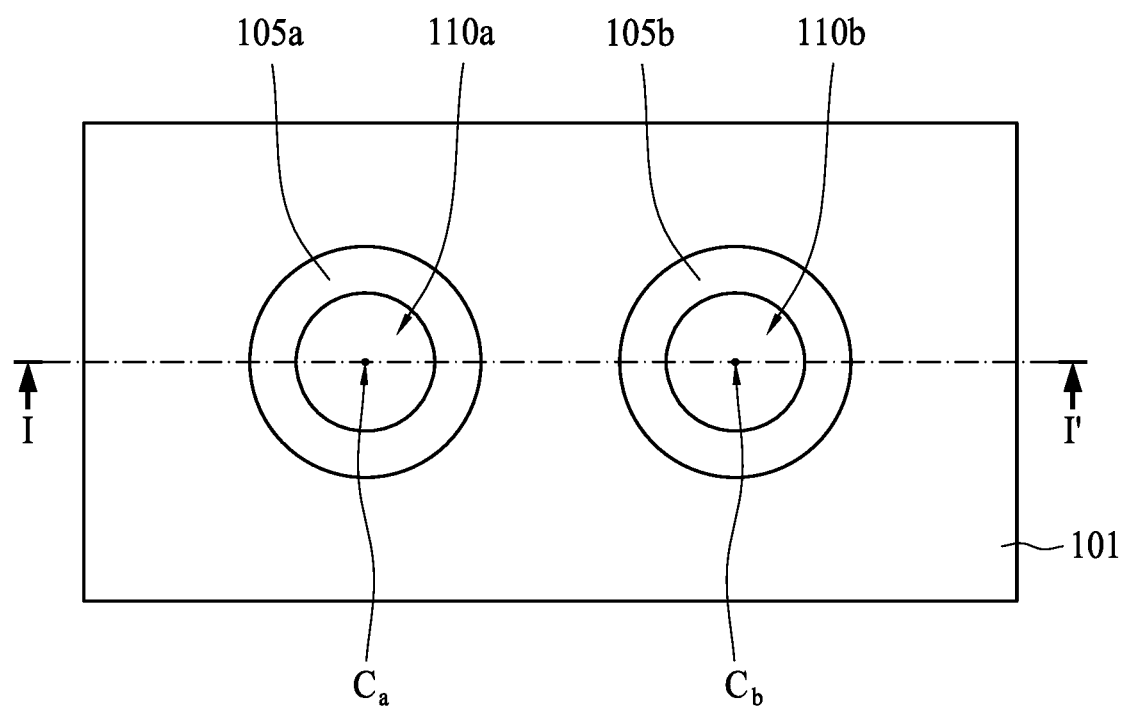
FIG. 6 is a top view illustrating an intermediate stage of preparing a semiconductor device structure, in accordance with some embodiments.
Figure 7:
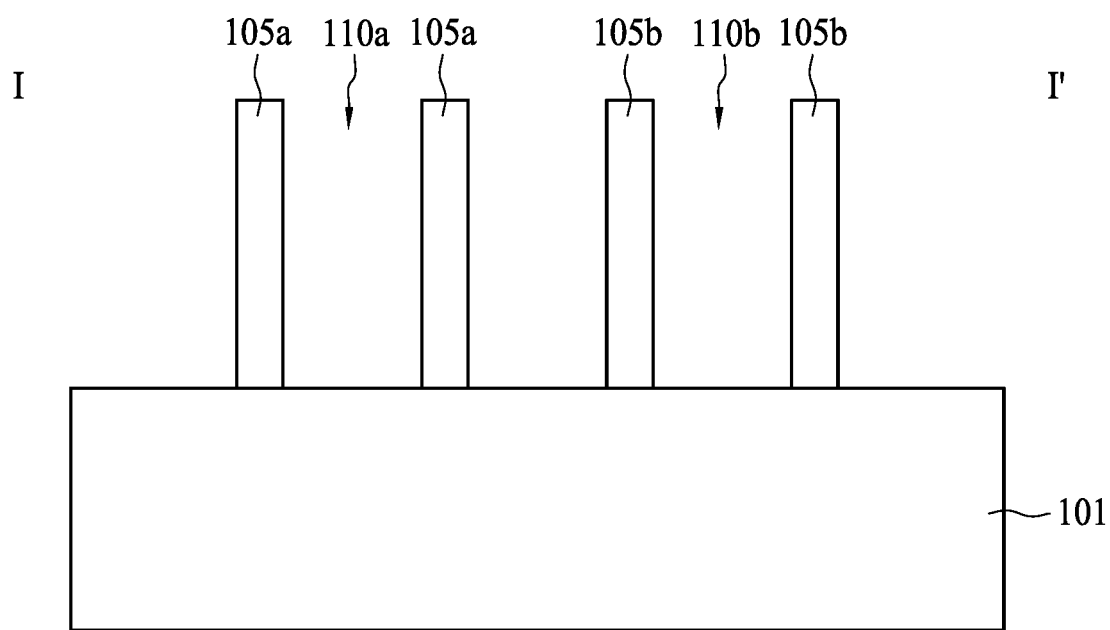
FIG. 7 is a cross-sectional view illustrating an intermediate stage of preparing a semiconductor device structure, taken along a sectional line I-I' in FIG. 6, in accordance with some embodiments.

FIG. 6 is a top view illustrating an intermediate stage of forming the semiconductor device structure 100, in accordance with some embodiments. FIG. 7 is a cross-sectional view illustrating an intermediate stage of forming the semiconductor device structure 100, taken along a sectional line I-I' in FIG. 6, in accordance with some embodiments.

As shown in FIGS. 6 and 7, the pillars 103a and 103b are removed to form openings 110a and 110b. In some embodiments, the pillar 103a is removed to form the opening 110a, such that the opening 110a is entirely surrounded by the ring structure 105a, and the pillar 103b is removed to form the opening 110b, such that the opening 110b is entirely surrounded by the ring structure 105b. In some embodiments, the top surface of the substrate 101 is exposed by the openings 110a and 110b.

In some embodiments, the pillars 103a and 103b are removed by an etching process, such as a dry etching process. As described above, the materials of the pillars 103a and 103b are different from the materials of the ring structures 105a and 105b, and the materials of the pillars 103a, 103b and the ring structures 105a, 105b are selected such that the etching selectivity of the pillars 103a and 103b with respect to the ring structures 105a and 105b is high. Therefore, the pillars 103a and 103b are removed by the etching process while the ring structures 105a and 105b may be substantially left in place, and the openings 110a and 110b are obtained.

Figure 8:
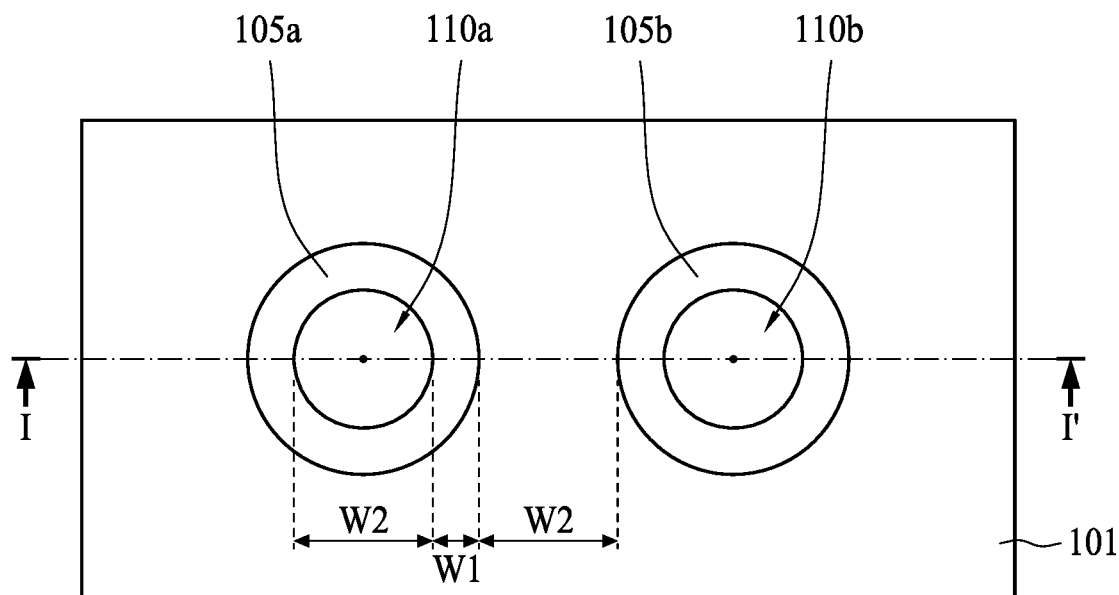
FIG. 8 is a top view illustrating an intermediate stage of preparing a semiconductor device structure, in accordance with some embodiments.
Figure 9:
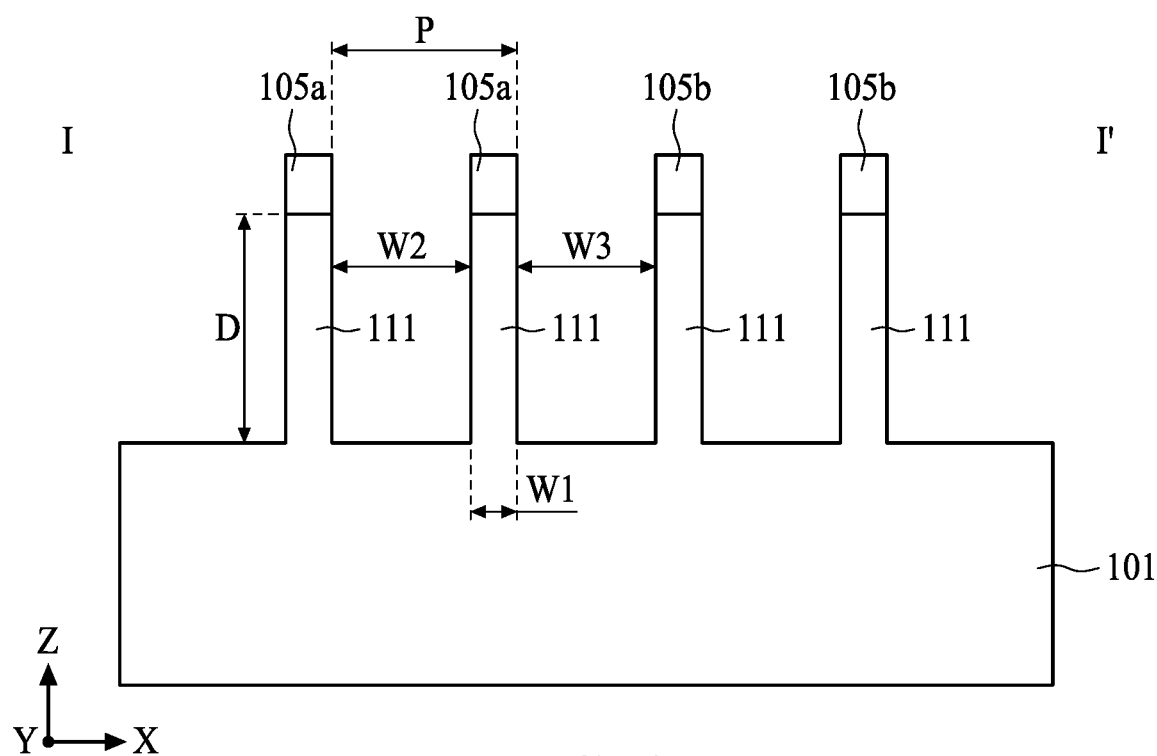
FIG. 9 is a cross-sectional view illustrating an intermediate stage of preparing a semiconductor device structure, taken along a sectional line I-I' in FIG. 8, in accordance with some embodiments.

FIG. 8 is a top view illustrating an intermediate stage of forming the semiconductor device structure 100, in accordance with some embodiments. FIG. 9 is a cross-sectional view illustrating an intermediate stage of forming the semiconductor device structure 100, taken along a sectional line I-I' in FIG. 8, in accordance with some embodiments. As shown in FIGS. 8 and 9, an etching process is performed to etch the substrate 101 to form annular semiconductor fins 111, wherein the ring structures 105a and 105b are used as etch hardmasks having images that define the annular semiconductor fins 111 to be formed from the substrate 101.

The annular semiconductor fins 111 are formed by recessing the portions of the substrate 101 that are exposed through the etch hardmasks 105a and 105b, down to a target depth D, as shown in FIG. 9. The annular semiconductor fins 111 are formed with an average width W1, and are separated by a pitch P. The annular semiconductor fins 111 are formed to have target lengths (not shown) that extend in the Y-direction. In some embodiments, the annular semiconductor fins 111 are formed with an average inner width (diameter) W2. In some embodiments, adjacent pairs of annular semiconductor fins 111 are separated by an average width W3. In some embodiments, W2 is greater than W1, and W2 is substantially the same as W3. In some embodiments, W2 is greater than about three times W1. In some embodiments, W3 is greater than about three times W1.

In one example embodiment, the average width W1 of the annular semiconductor fins 111 is in a range of about 5 nm to about 20 nm, the length of the annular semiconductor fins 111 is in a range of about 50 nm to about 1000 nm, and the pitch P of the annular semiconductor fins 111 is in a range of about 20 nm to about 100 nm. Further, the initial height (defined by the recess depth D) of the annular semiconductor fins 111 is in a range of about 30 nm to about 100 nm. The term "average width" refers to the fact that in practice, each vertical semiconductor fin 111 could have a slightly sloped sidewall profile from the top to the bottom of the vertical semiconductor fin. In this regard, the term "average width" of a semiconductor fin denotes a mean width of the vertical semiconductor fin across its vertical height.

Figure 10:
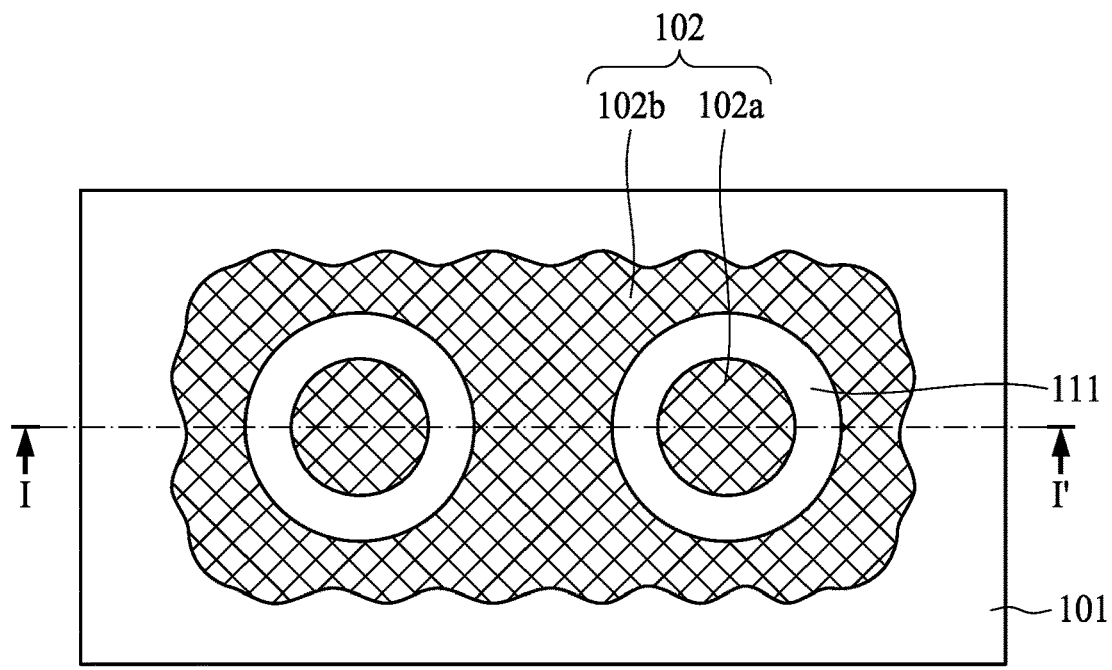
FIG. 10 is a top view illustrating an intermediate stage of forming the semiconductor device structure, in accordance with some embodiments.
Figure 11:
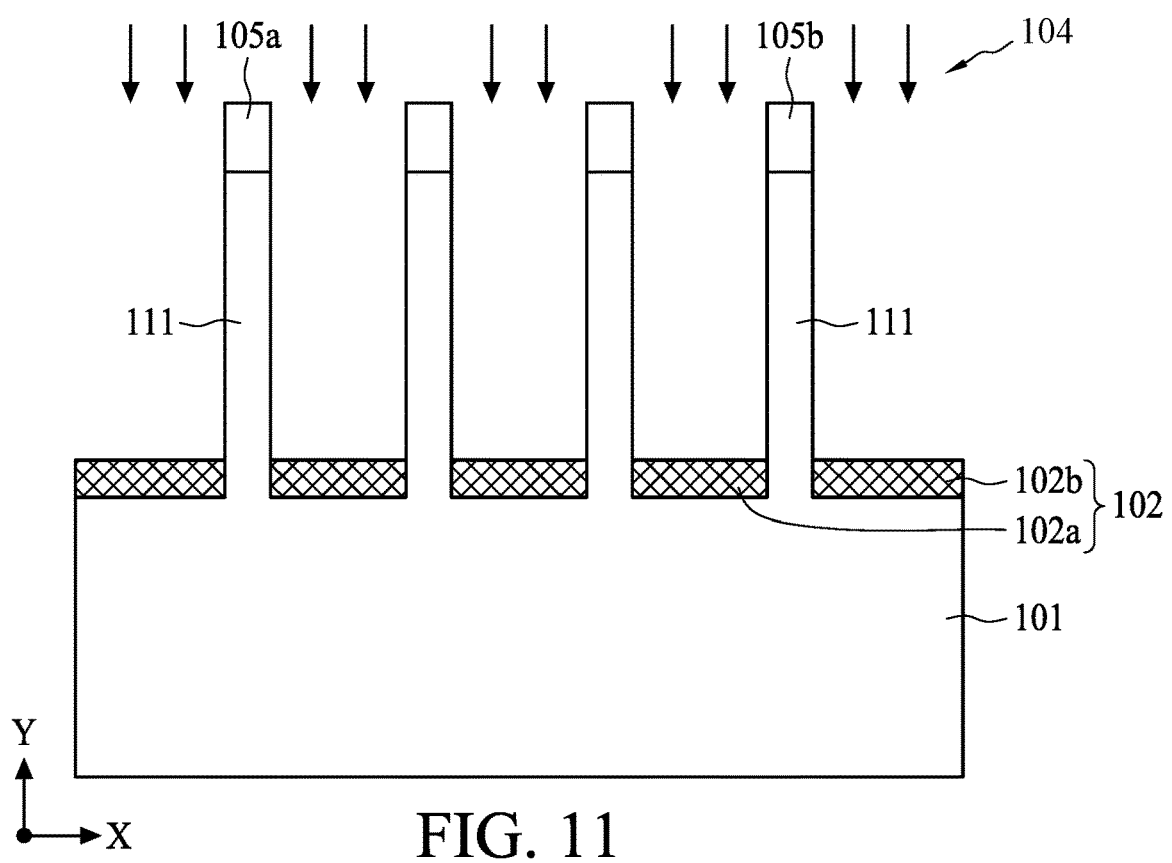
FIG. 11 is a cross-sectional view illustrating an intermediate stage of forming the semiconductor device structure, taken along a sectional line I-I' in FIG. 10, in accordance with some embodiments.

FIG. 10 is a top view illustrating an intermediate stage of forming the semiconductor device structure 100, in accordance with some embodiments. FIG. 11 is a cross-sectional view illustrating an intermediate stage of forming the semiconductor device structure 100, taken along a sectional line I-I' in FIG. 10, in accordance with some embodiments. A next stage of the semiconductor fabrication process comprises forming a plurality of processed areas 102 on a top portion of the substrate 101 exposed by the annular semiconductor fin 111, as schematically illustrated in FIGS. 10 and 11. In some embodiments, the plurality of processed areas 102 includes an inner processes area 102a inside the annular semiconductor fin 111 and an outer processes area 102b outside annular semiconductor fin 111. In some embodiments, the formation of the processed areas 130 may include an ion implantation process 104. In contrast to the traditional ion implantation used for doping, the purpose of the ion implantation process 104 in the present embodiment is to damage the exposed horizontal surfaces of the substrate 101 to form the processed areas 130 so that the subsequent formation of the spacer 113 may exclude the processed areas 130.

Figure 12:
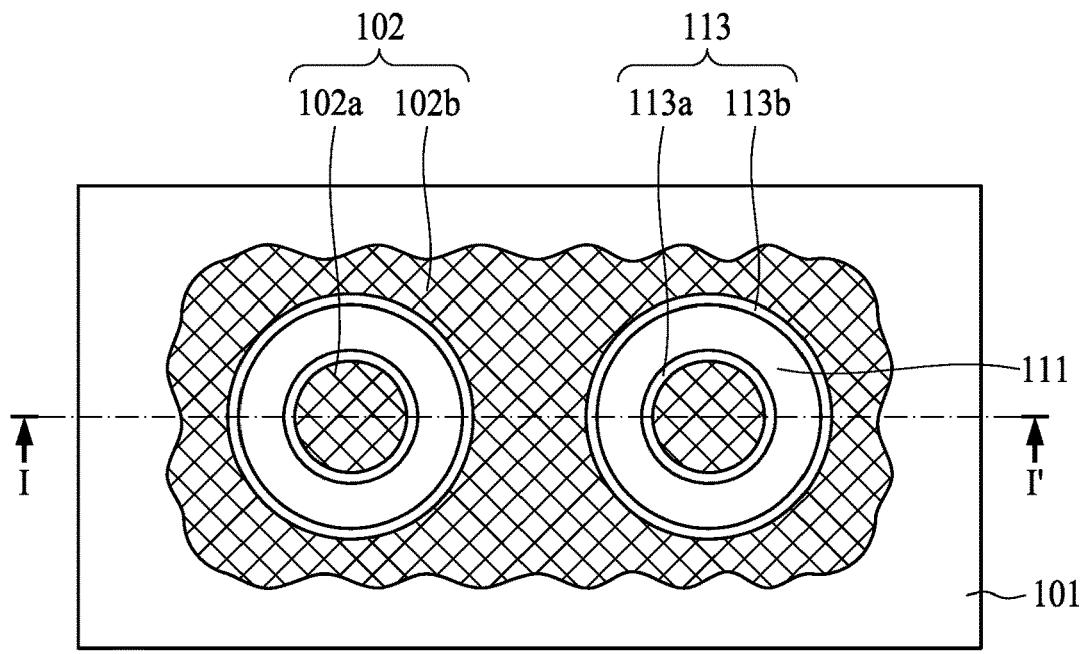
FIG. 12 is a top view illustrating an intermediate stage of forming the semiconductor device structure, in accordance with some embodiments.
Figure 13:
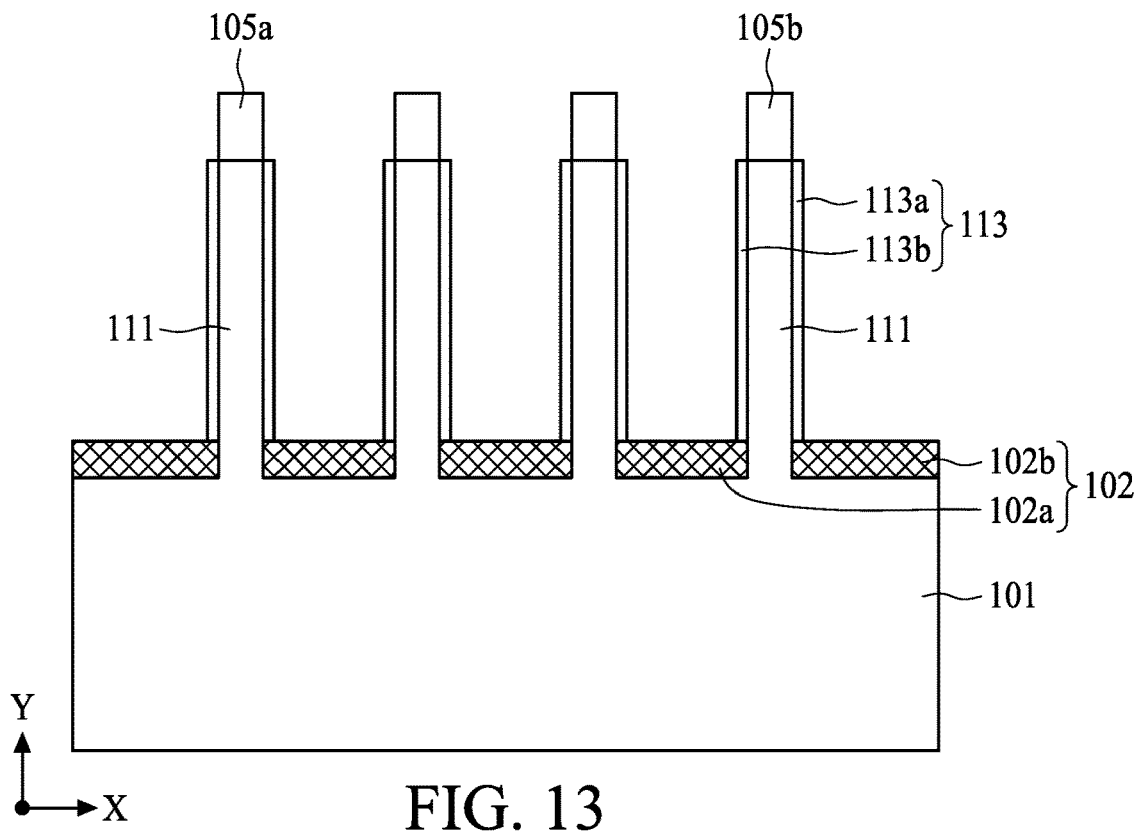
FIG. 13 is a cross-sectional view illustrating an intermediate stage of forming the semiconductor device structure, taken along a sectional line I-I' in FIG. 10, in accordance with some embodiments.

FIG. 12 is a top view illustrating an intermediate stage of forming the semiconductor device structure 100, in accordance with some embodiments. FIG. 13 is a cross-sectional view illustrating an intermediate stage of forming the semiconductor device structure 100, taken along a sectional line I-I' in FIG. 12, in accordance with some embodiments. A next stage of the semiconductor fabrication process comprises selectively forming a plurality of spacers 113 on side surfaces of the annular semiconductor fin 111, as schematically illustrated in FIGS. 10 and 11. In some embodiments, the plurality of spacers 113 includes an inner spacer 113a on an inner side surface of the annular semiconductor fin 111 and an outer spacer 113b on an outer side surface of the annular semiconductor fin 111.

As previously mentioned, the processed areas 102, which includes all exposed horizontal surfaces of the substrate 101, are damaged so the spacers 113 cannot form on them. The spacers 113 are therefore formed selectively on the side surfaces of the annular semiconductor fin 111. In some embodiments, the formation of the spacers 113 may include thermal oxidation of the annular semiconductor fin 111 including silicon. Thermal oxidation oxidizes the side surface of the annular semiconductor fin 111 and forms a layer of silicon dioxide, which comprises the spacers 113; while the other surfaces, such as the ring structures 105a, 105b and the processed areas 102, are processed so that no silicon dioxide can be formed thereon. The aforementioned ion implantation can be used in such an embodiment to damage the processed areas 102 to limit the oxidation on the side surfaces of the annular semiconductor fin 111.

Figure 14:
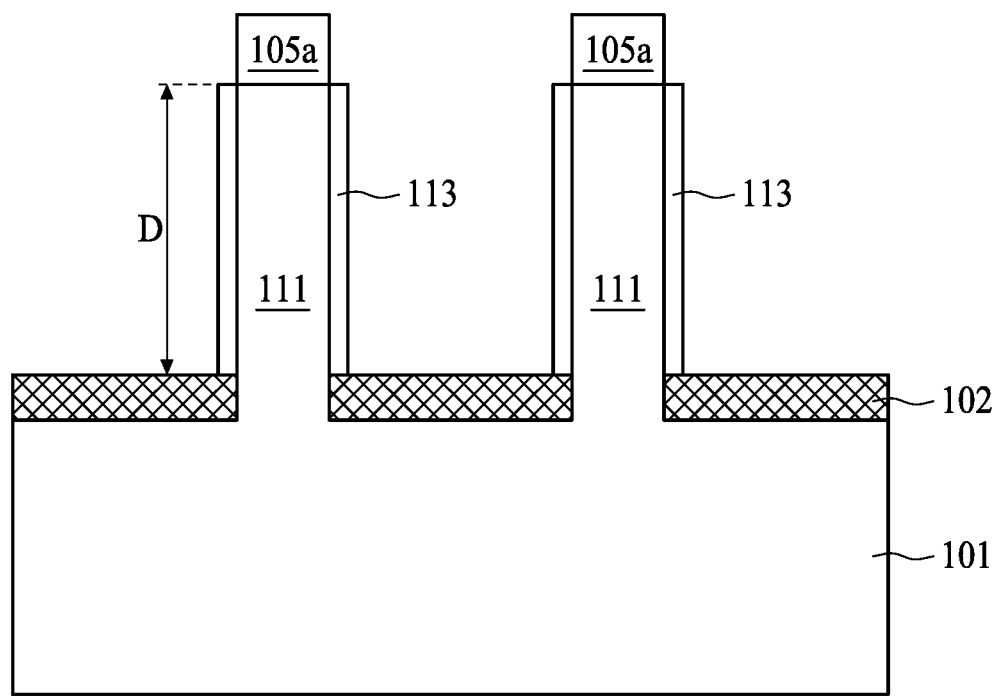
FIG. 14 is a schematic view of the semiconductor device structure of FIG. 13 after recessing the surface of the substrate down to a target depth below a bottom level of the spacers, in accordance with some embodiments.
Figure 15:
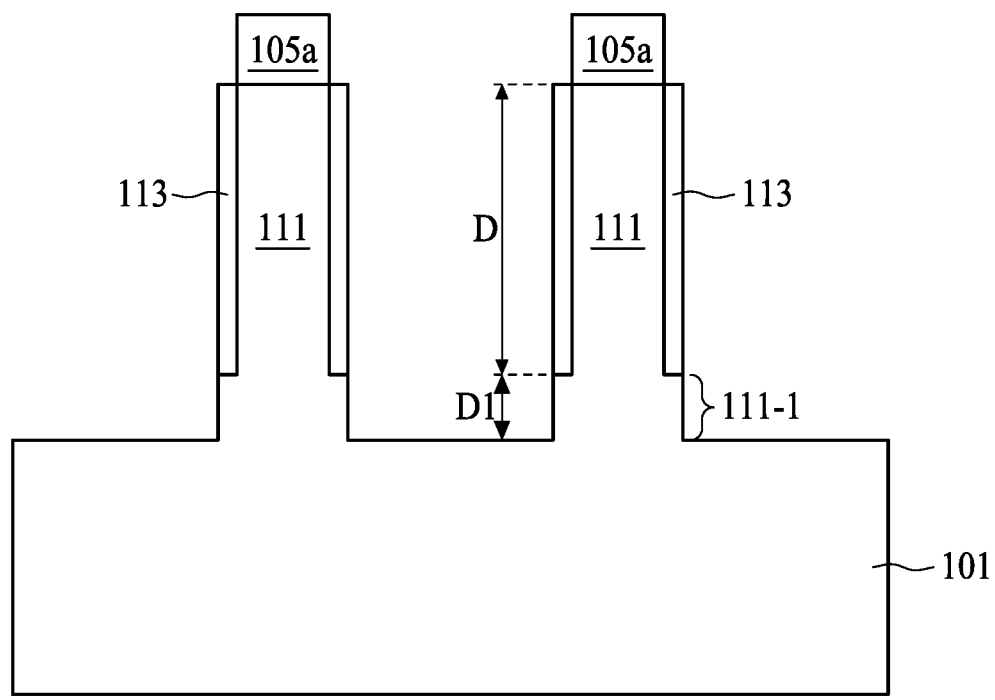
FIG. 15 is a schematic view of the semiconductor device structure of FIG. 14 after the formation of an extended bottom portion of the annular semiconductor fins, in accordance with some embodiments.
Figure 16:
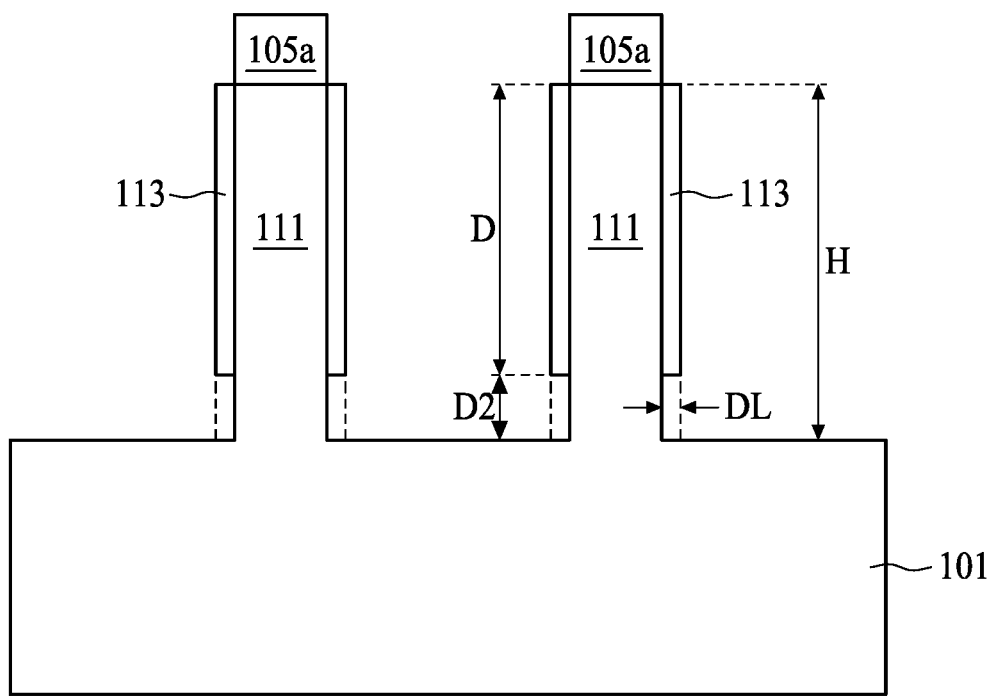
FIG. 16 is a schematic view of the semiconductor device structure of FIG. 15 after performing a lateral etch process to laterally etch exposed bottom portions 111-1 of the annular semiconductor fins 111 to a target lateral recess depth DL, in accordance with some embodiments.

Please note that the left part of FIGS. 12 and 13 are used in the following description for clarity of illustration. A next stage of the semiconductor fabrication process comprises forming the lower source/drain regions 115 using a process flow as schematically illustrated in FIGS. 14 to 16. In an initial step, FIG. 14 is a schematic view of the semiconductor device structure of FIG. 13 after recessing the surface of the substrate 101 down to a target depth below a bottom level of the spacers 113. In some embodiments, the recess process is performed using a directional anisotropic dry etch process, which is configured to vertically etch the exposed surface of the substrate 101 selective to the materials of the etch hardmask 105a and the sidewall spacers 113. In some embodiments, the surface of the substrate 101 is further recessed to a depth D1, wherein the depth D1 is in a range of about 30 nm to about 50 nm below a bottom level of the sidewall spacers 113. In some embodiments, the recess process removes the processes area 102 from the substrate 101. In some embodiments, the recess process shown in FIG. 15 results in the formation of an extended bottom portion 111-1 of the annular semiconductor fins 111, which increases the height of the annular semiconductor fins 111 (i.e., the initial height D of the annular semiconductor fins 111 is increased by D1).

FIG. 16 is a schematic view of the semiconductor device structure of FIG. 15 after performing a lateral etch process to laterally etch exposed bottom portions 111-1 of the annular semiconductor fins 111 to a target lateral recess depth DL. In some embodiments, the exposed sidewalls of the extended bottom portions 111-1 of the annular semiconductor fins 111 are laterally etched to reduce the width of the bottom portions 111-1 of the annular semiconductor fins 111 to be substantially equal to the average width W of the upper portion of the annular semiconductor fins 111. In this regard, in some embodiments, the lateral recess depth DL is performed to a depth that is substantially equal to a thickness of the sidewall spacers 113.

The lateral recess process of FIG. 16 can be performed using an isotropic dry etch or wet etch process, having an etch chemistry which is configured to etch the semiconductor material (e.g., Si) of the substrate 101 selective to the insulating materials (e.g., SiN) of the etch hardmask 105a and the sidewall spacers 113. The isotropic etch process further results in a slight recessing of the lateral surfaces of the substrate 101 so that a resulting recess depth D2 as shown in FIG. 16 is slightly greater than the recess depth D1 shown in FIG. 15. As a result of the semiconductor recess steps of FIGS. 15 and 16, the annular semiconductor fins 111 shown in FIG. 16 have a resulting height H equal to D+D2.

Figure 17:
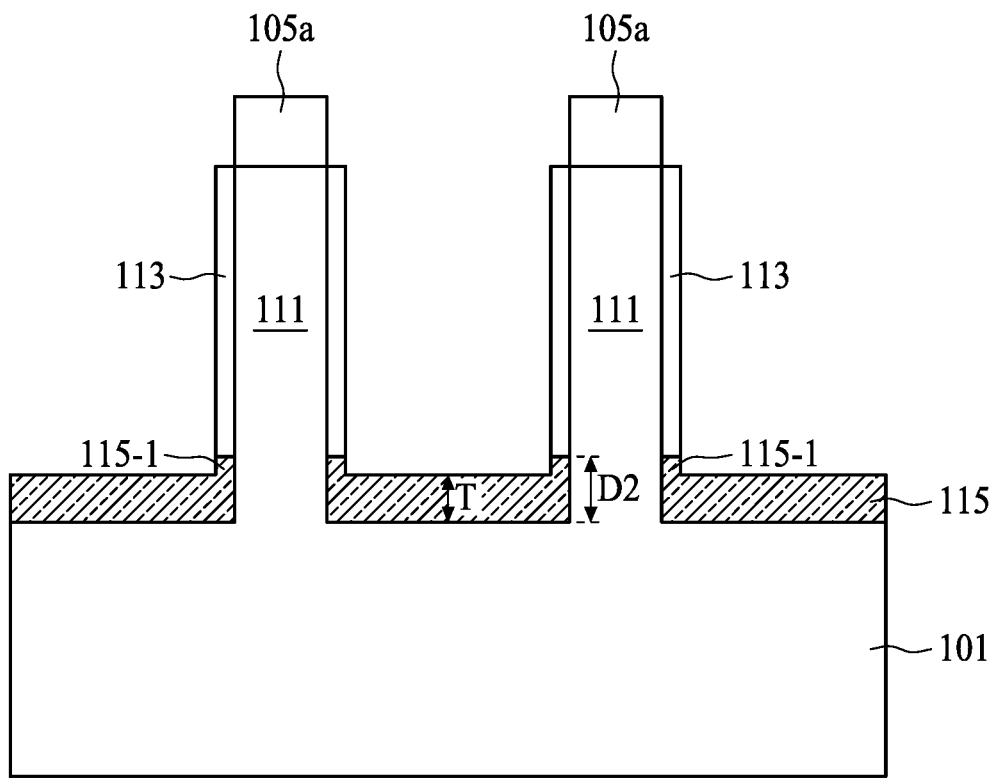
FIG. 17 is a schematic view of the semiconductor device structure of FIG. 16 after forming the lower source/drain regions 115 on exposed portions of the substrate 101 adjacent to the bottom portions of the annular semiconductor fins 111, in accordance with some embodiments.

FIG. 17 is a schematic view of the semiconductor device structure of FIG. 16 after forming the lower source/drain regions 115 on exposed portions of the substrate 101 adjacent to the bottom portions of the annular semiconductor fins 111. In some embodiments, the lower source/drain regions 115 comprise crystalline semiconductor material which is epitaxially grown using a bottom-up epitaxial growth process in which epitaxial growth of crystalline semiconductor material starts on the exposed lateral recessed surfaces of the substrate 101, and continues upward until a target thickness T is reached. In some embodiments, the thickness T of the lower source/drain regions 115 is in a range of about 20 nm to about 30 nm, which is less than the recess depth D2.

With the bottom-up growth process, the epitaxial growth rate on the lateral surfaces of the substrate 101 is greater than the growth rate on the vertical sidewalls of the bottom portions of the annular semiconductor fins 111. In this regard, there can be a small amount of epitaxial material 115-1 formed on the sidewalls of the annular semiconductor fins 111 just below the spacers 113, as shown in FIG. 17. In some embodiments, as shown in FIG. 17, the extra epitaxial material 115-1 essentially results in a thicker profile of the lower source/drain regions 115 adjacent to the bottom portions of the annular semiconductor fins 111. As explained in further detail below, the extra epitaxial material 115-1 is oxidized during a subsequent process in which the self-aligned bottom insulating spacers 121 are formed.

The lower source/drain regions 115 are formed with an epitaxial semiconductor material that is suitable for the given type of vertical FET devices that are to be formed in the device region shown in the drawings. For example, for n-type vertical FETs, the lower source/drain regions 115 can be formed with crystalline Si, and for p-type vertical FETs, the lower source/drain regions 115 can be formed with crystalline SiGe (e.g., with a Ge concentration of about 40%). The lower source/drain regions 115 can be epitaxially grown using known techniques, such as CVD (chemical vapor deposition), MOCVD (metal-organic chemical vapor deposition), LPCVD (low pressure chemical vapor deposition), MBE (molecular beam epitaxy), VPE (vapor-phase epitaxy), MOMBE (metal organic molecular beam epitaxy), or other known epitaxial growth techniques. The epitaxial growth is performed selectively so that epitaxial semiconductor material is not formed on the exposed surfaces of sidewall spacers 113 and the etch hardmask 105a.

In some embodiments, the lower source/drain regions 115 comprise doped epitaxial semiconductor material. The lower source/drain regions 115 can be doped using known techniques. For example, in some embodiments, the lower source/drain regions 115 can be in-situ doped wherein dopants are incorporated into epitaxial material during the epitaxial growth of the lower source/drain regions 115 using a dopant gas such as, for example, a boron-containing gas such as $BH_3$ for pFETs or a phosphorus- or arsenic-containing gas such as $PH_3$ or $AsH_3$ for nFETs. In another embodiment, dopants can be incorporated in the lower source/drain regions 115 after the epitaxy process using doping techniques such as ion implantation.

Figure 18:
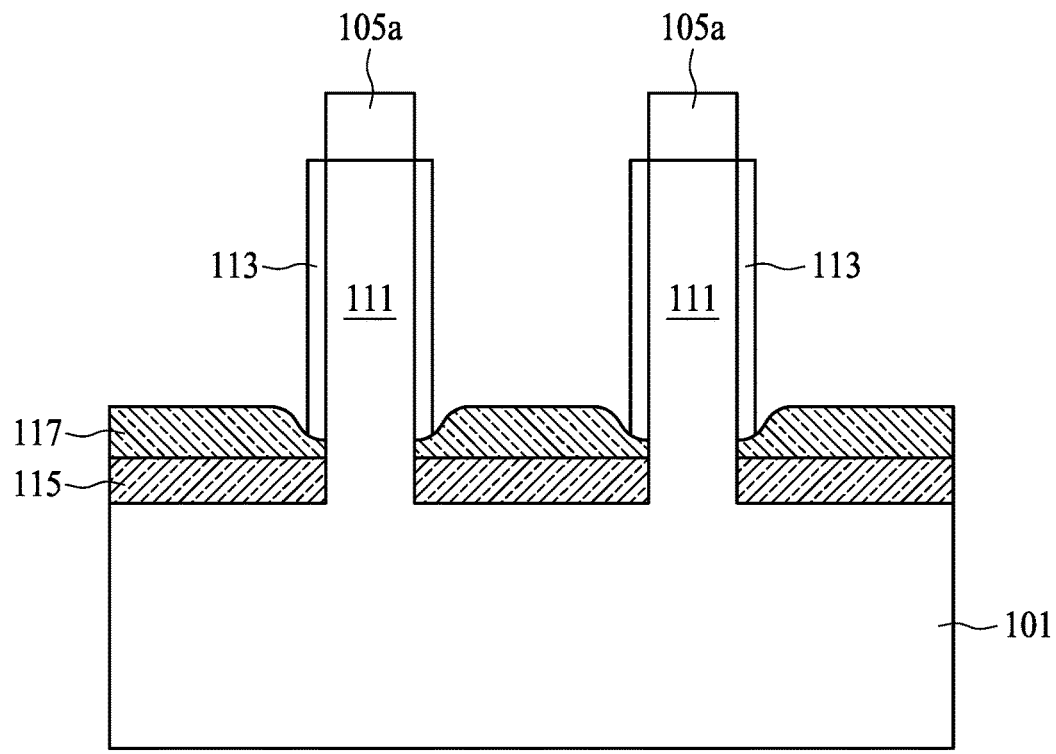
FIG. 18 is a schematic cross-sectional side view of the semiconductor device structure of FIG. 17 after forming sacrificial epitaxial semiconductor layers, in accordance with some embodiments.
Figure 19:
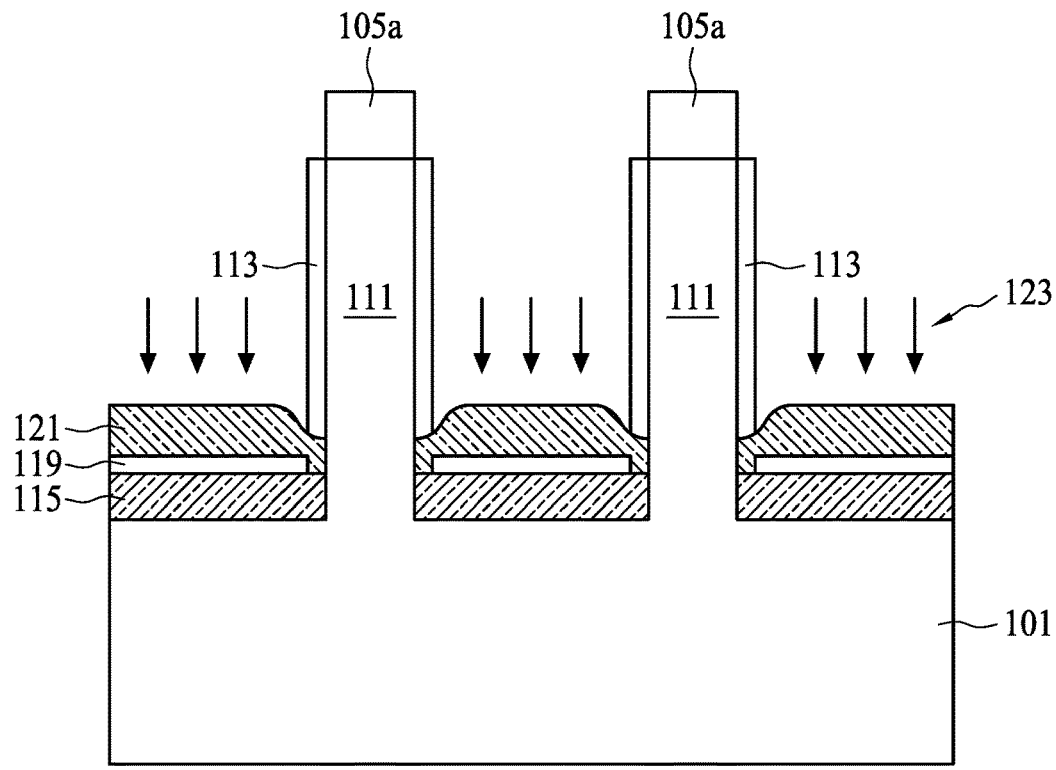
FIG. 19 is a schematic cross-sectional side view of the semiconductor device structure of FIG. 18 showing an oxidation process 123 that is performed to oxidize the sacrificial epitaxial semiconductor layers, in accordance with some embodiments.

Next, the self-aligned bottom insulating spacers 121 are formed using a process which is schematically illustrated in FIGS. 18 and 19. In some embodiments, FIG. 18 is a schematic view of the semiconductor device structure of FIG. 15 after forming sacrificial epitaxial semiconductor layers 117 on top of the lower source/drain regions 115, and FIG. 19 is a schematic view of the semiconductor device structure of FIG. 18 showing an oxidation process 123 that is performed to oxidize the sacrificial epitaxial semiconductor layers 117 and form the self-aligned bottom insulating spacers 121. In some embodiments, the sacrificial epitaxial semiconductor layers 117 are formed by growing epitaxial SiGe semiconductor material on top of the lower source/drain regions 115. The sacrificial SiGe semiconductor material is then selectively oxidized to convert the sacrificial epitaxial semiconductor layers 117 into silicon oxide ($SiO_2$) layers, resulting in the format ion of the self-aligned bottom insulating spacers 121.

In some embodiments, the epitaxial SiGe material of the sacrificial epitaxial semiconductor layers 117 comprises a Ge concentration that is higher than a Ge concentration of the epitaxial material of the lower source/drain regions 115. For example, in embodiments where the lower source/drain regions 115 are formed of crystalline Si (with no Ge), the sacrificial epitaxial semiconductor layer 117 can be formed with a Ge concentration in a range of about 10% to about 70%. In embodiments where the lower source/drain regions 115 are formed of crystalline SiGe with a given Ge concentration of X%, the sacrificial SiGe layer 117 can be formed with a Ge concentration in a range of about X+10% to about X+70%. The higher Ge concentration of the sacrificial epitaxial semiconductor layer 117 facilitates oxidation of the sacrificial SiGe layer 117 at a rate which is significantly greater than an oxidation rate of pure Si epitaxial material or a SiGe epitaxial material with a lower Ge concentration.

The oxidation process 123 shown in FIG. 19 can be performed using a selective SiGe oxidation process to oxidize the epitaxial semiconductor material of the sacrificial epitaxial semiconductor layers 117 highly selective to the semiconductor materials of the lower source/drain regions 115 and the lower portions of the annular semiconductor fins 111 which are disposed adjacent to the layers 115 and 117. For example, the selective oxidation process 123 can be performed using a radical oxidation process, a plasma oxidation process, a low-temperature thermal oxidation process, or any other similar or suitable type of selective oxidation process that is configured to oxidize the sacrificial epitaxial semiconductor layers 117 selective to the other semiconductor materials.

As shown in FIG. 19, the selective oxidation process results in the formation of high-concentration germanium semiconductor layers 119 between the bottom insulating spacers 121 and the lower source/drain regions 115. The high-concentration germanium semiconductor layers 119 are formed as a result of the selective oxidation process in which the Ge atoms of the sacrificial layers 117 are essentially "snow-plowed" toward the interface between the SiGe sacrificial layers 117 and the lower source/drain regions 115 as the SiGe sacrificial layers 117 are oxidized and converted to SiO$_2$. In some embodiments, the high-concentration germanium semiconductor layers 119 are formed within the upper surface regions of the lower source/drain regions 115, wherein Ge atoms from the sacrificial epitaxial semiconductor layers 117 are injected into the upper surfaces of the lower source/drain regions 115.

As further shown in FIG. 19, the extra epitaxial material 115-1 (as shown in FIG. 17) is oxidized as a result of the selective oxidation process 123, thereby resulting in the formation of a uniform interface between the self-aligned bottom insulating spacers 121 and the lower portions of the annular semiconductor fins 111. In addition, because of the selectivity of the oxidation process 123, there is no, or an insignificant amount of, oxidation of the semiconductor material at the lower portion of the annular semiconductor fins 111 adjacent to the self-aligned bottom insulating spacers 121.

Figure 20:
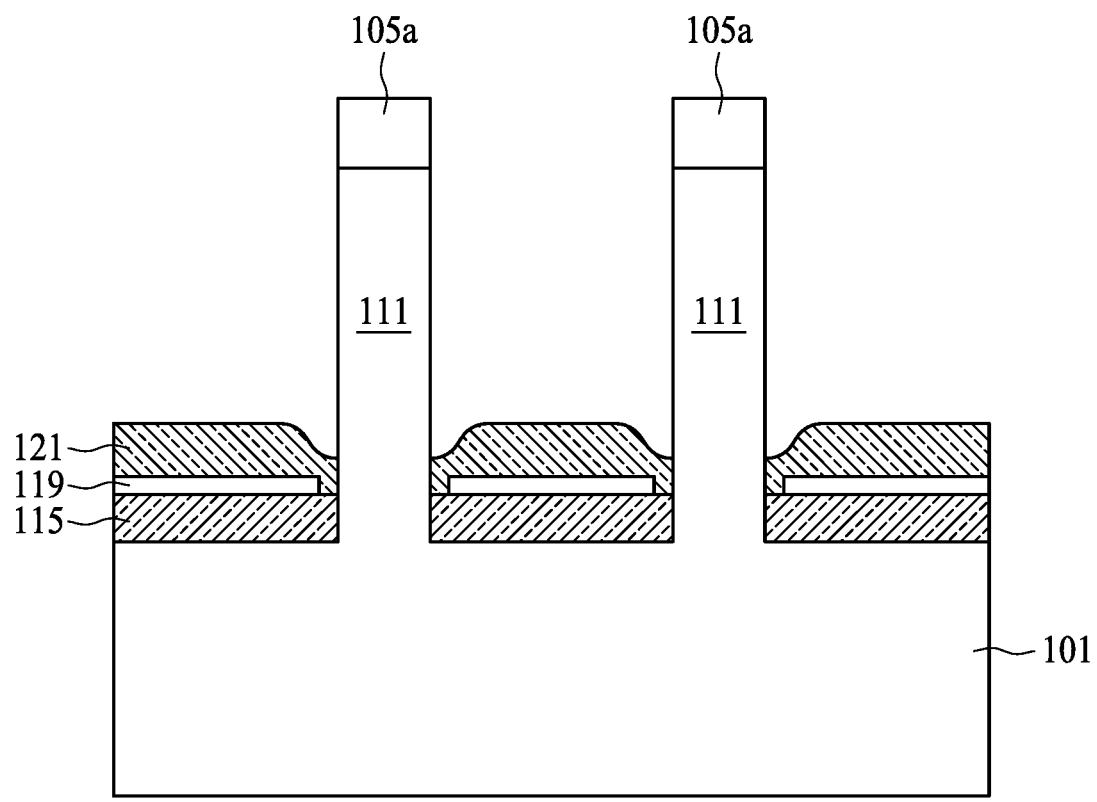
FIG. 20 is a schematic cross-sectional side view of the semiconductor device structure of FIG. 19 after removing the sidewall spacers from the annular semiconductor fins, in accordance with some embodiments.

FIG. 20 is a schematic view of the semiconductor device structure of FIG. 19 after removing the sidewall spacers 113 from the annular semiconductor fins 111. In some embodiments, the sidewall spacers 113 are removed using an isotropic etch process (e.g., dry or wet etch) having an etch chemistry which is configured to etch the material (e.g., SiN) of the sidewall spacers 113 selective to the material (e.g., SiO$_2$) of the self-aligned bottom insulating spacers 121.

Figure 21:
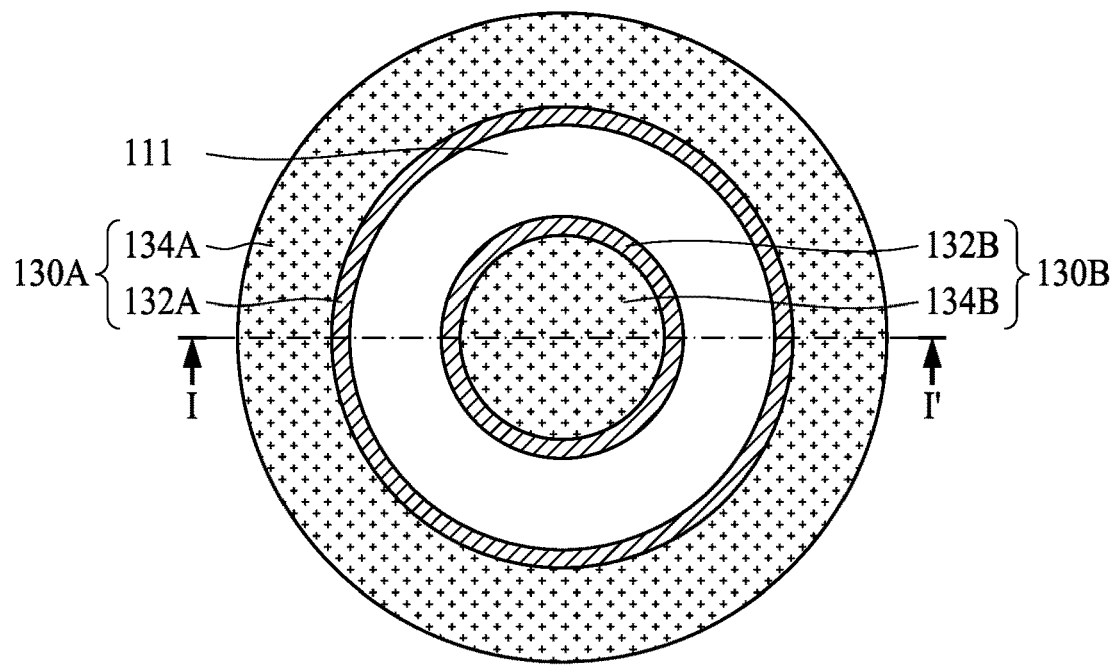
FIG. 21 is a top view illustrating an intermediate stage of forming the semiconductor device structure, in accordance with some embodiments.
Figure 22:
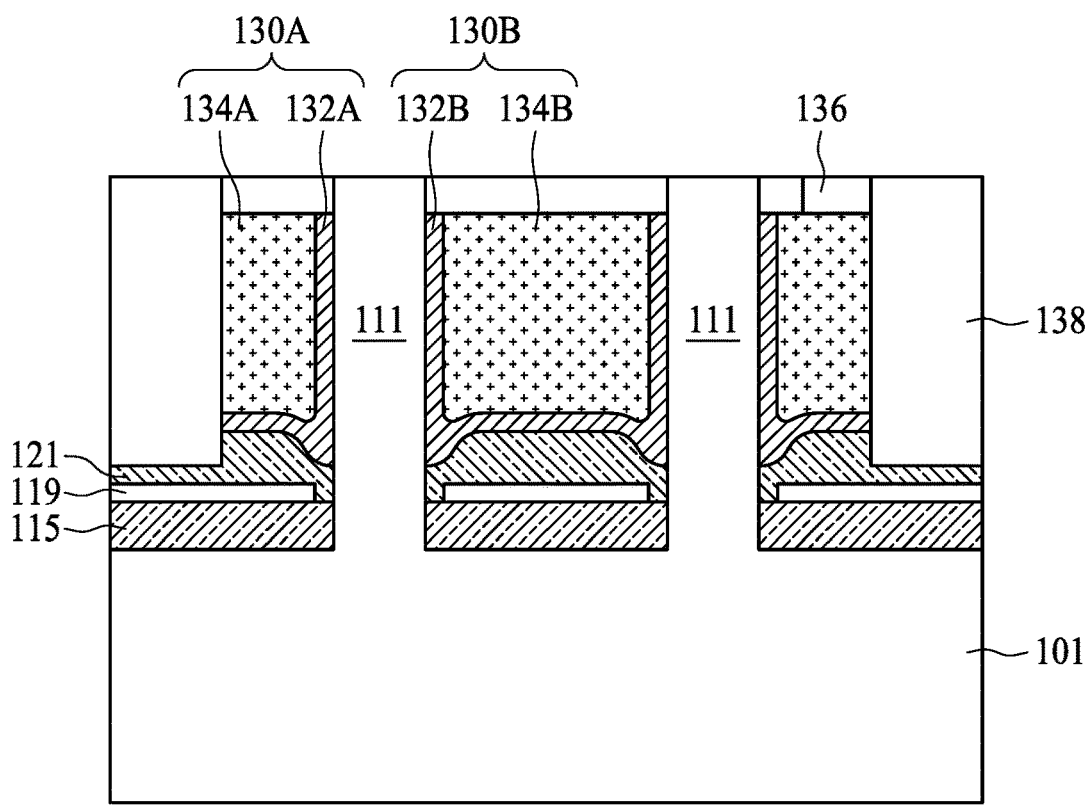
FIG. 22 is a cross-sectional view illustrating an intermediate stage of forming the semiconductor device structure, taken along a sectional line I-I' in FIG. 21, in accordance with some embodiments.

FIG. 21 is a top view illustrating an intermediate stage of forming the semiconductor device structure 100, in accordance with some embodiments. FIG. 22 is a cross-sectional view illustrating an intermediate stage of forming the semiconductor device structure 100, taken along a sectional line I-I' in FIG. 21, in accordance with some embodiments. Following the formation of the intermediate structure shown in FIG. 19, any suitable sequence of FEOL process modules may be implemented to form an outer gate structure 130A, an inner gate structure 130B, upper insulating spacers 136, and an ILD layer 138, as shown in FIG. 21 and FIG. 22.

For example, the outer gate structure 130A and the inner gate structure 130B are formed by depositing one or more conformal layers of gate dielectric material serving as the gate dielectric layers 132A and 132B over the outer and inner sidewall surfaces of the annular semiconductor fins 111. The gate dielectric material may comprise, e.g., nitride, oxynitride, or oxide, or a high-k dielectric material having a dielectric constant of about 3.9 or greater. In particular, the conformal layer of gate dielectric material can include silicon oxide, silicon nitride, silicon oxynitride, boron nitride, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The high-k gate dielectric material may further include dopants such as lanthanum or aluminum. In some embodiments, the conformal layer of gate dielectric material is formed with a thickness in a range of about 0.5 nm to about 2.5 nm, which will vary depending on the target application. The conformal gate dielectric layers are deposited using known methods such as ALD, for example, which allows for high conformity of the gate dielectric material.

Next, a layer of conductive material serving as the gate electrode layers 134A and 134B is deposited and planarized down to an upper surface of the etch hardmask 105a, which essentially removes the overburden gate dielectric material and conductive material that is disposed above the upper surfaces of the etch hardmask 105a. The layer of conductive material (which forms the gate electrode layers 134A and 134B) is formed by depositing a conductive material including, but not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver or gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide or nickel silicide), carbon nanotube, conductive carbon, graphene, or any suitable combination of such conductive materials. The layer of conductive material may further comprise dopants that are incorporated during or after deposition. The layer of conductive material is deposited using a suitable deposition process, for example, CVD, PECVD, PVD, plating, thermal or e-beam evaporation, sputtering, etc.

Following the planarizing process, the layer of conductive material is recessed down to a target depth to form the outer gate electrode layer 134A and the inner gate electrode layer 134B, wherein the recessed thickness defines a gate length ($L_g$) of the vertical FET devices. The gate recess process can be performed using well-known etch-back/recess techniques in which a timed etch process is performed to etch the layer of conductive material down to a target recess level to form the outer gate electrode layer 134A and the inner gate electrode layer 134B. Following the recess process, the exposed portions of the gate dielectric material on the upper portions of the annular semiconductor fins 111 are removed, thereby forming the outer gate structure 130A and the inner gate structure 130B. The exposed portions of the gate dielectric material can be etched using a dry or wet etch process which is selective to the materials of the annular semiconductor fins 111, the outer gate electrode layer 134A, the inner gate electrode layer 134B, and the etch hardmask 105a.

A next step in the fabrication process includes forming the upper insulating spacers 136 on the upper surfaces of the outer gate structure 130A and the inner gate structure 130B. In some embodiments, the upper insulating spacers 136 are formed by depositing a layer of insulating material such as silicon oxide, or other types of insulating materials (e.g., low-k dielectric materials) such as SiN, SiBCN or SiOCN. The upper insulating spacers 136 may be formed using a directional deposition process in which the dielectric/insulating material is directly deposited on lateral surfaces, or by blanket depositing the dielectric/insulating material followed by planarizing and recessing the dielectric/insulating material, using well-known deposition and etching techniques.

Following formation of the upper insulating spacers 136, the ILD layer 138 can be formed by etching trench openings through the stack of layers 136, 134A, 132A, and into portions of the self-aligned bottom insulating spacers 121, and then filling the trench openings with insulating material to form the ILD layer 138. This process serves to form a separate outer gate structure 130A that surrounds the respective vertical semiconductor fin 111, and that is electrically insulated from the other out gate structures 130A via the ILD layer 138.

Figure 23:
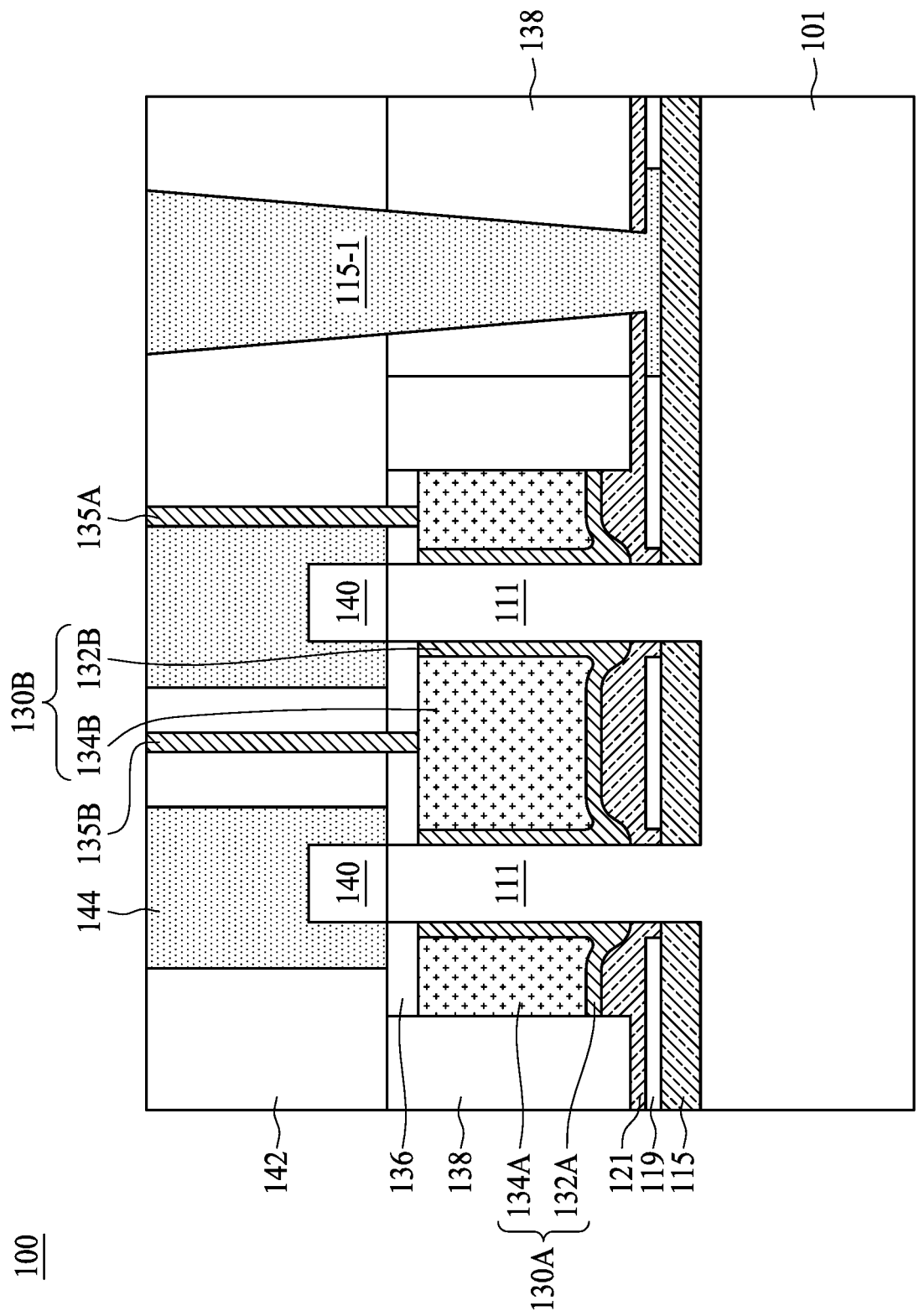
FIG. 23 is a schematic cross-sectional side view of the semiconductor device structure of FIG. 19 after forming the upper source/drain regions, the ILD layer, the vertical source/drain contacts, and a vertical source/drain contact connecting to the lower source/drain region, in accordance with some embodiments.

FIG. 23 is a schematic cross-sectional side view of the semiconductor device structure of FIG. 22 after forming the upper source/drain regions 140, the ILD layer 142, a first vertical source/drain contacts 144, a second vertical source/drain contact 115-1 connecting to the lower source/drain region 115, a first gate contact 135A connecting to the outer gate electrode layer 134A, and a second gate contact 135B connecting to the inner gate electrode layer 134B. The upper source/drain regions 140 are formed by epitaxially growing doped epitaxial semiconductor layers (e.g., doped Si or SiGe layers) on the exposed upper portions of the annular semiconductor fins 111 using known selective epitaxial growth techniques.

Figure 24:
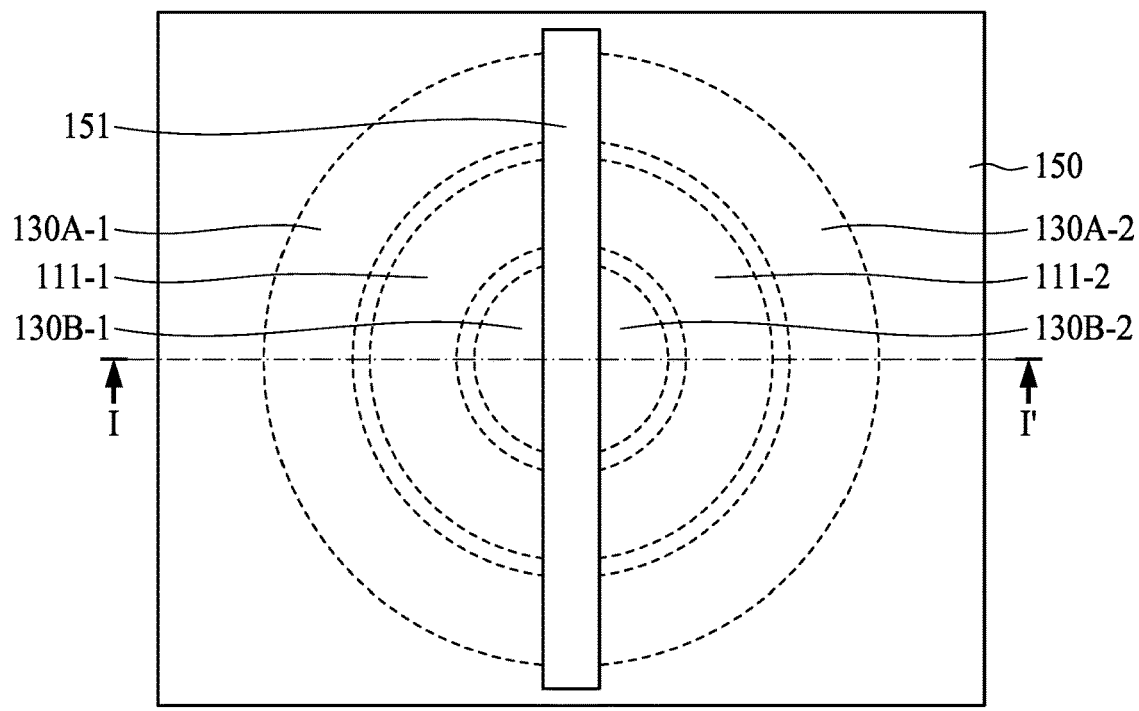
FIGS. 24 and 25 are a top view and a schematic cross-sectional side view of the semiconductor device structure of FIG. 23 after forming a mask layer having an aperture exposing a portion of the annular semiconductor fin, in accordance with some embodiments.
Figure 25:
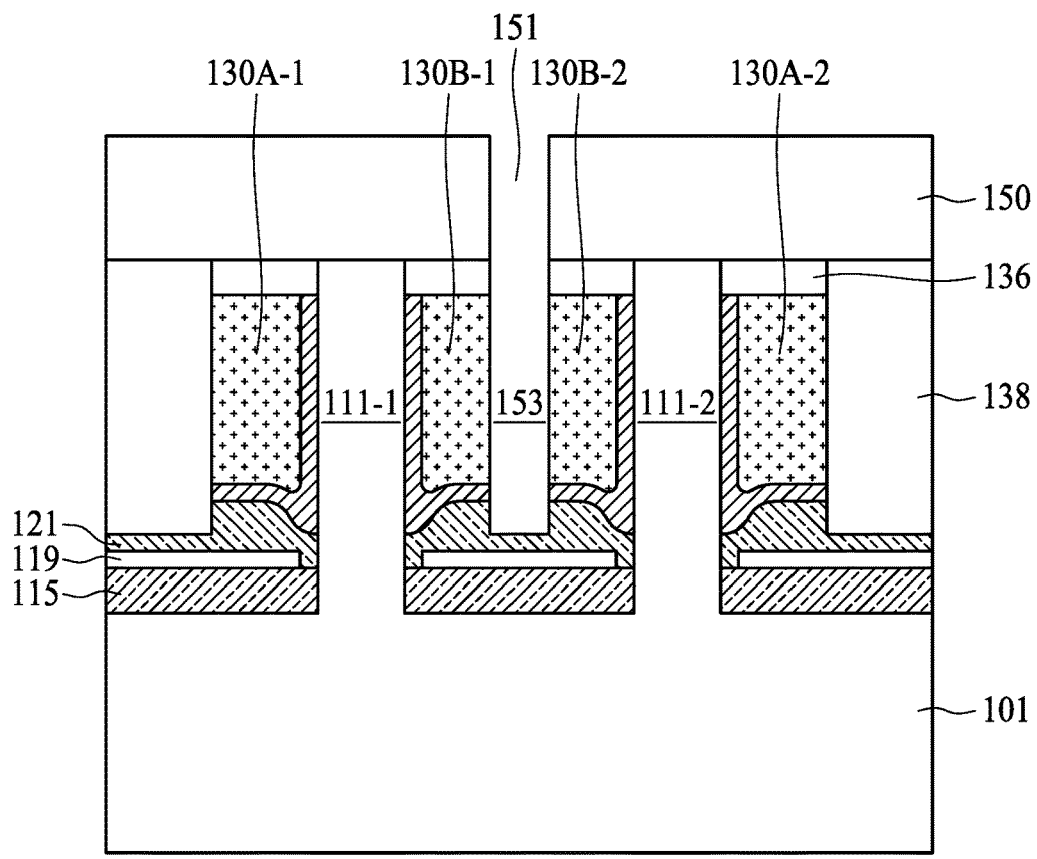

FIGS. 24 and 25 are a top view and a schematic cross-sectional side view of the semiconductor device structure of FIG. 23 after forming a mask layer 150 having an aperture 151 exposing a portion of the annular semiconductor fin 111. In some embodiments, the aperture 151 also exposes a portion of the inner gate structure 130B and the outer gate structure 130A. In some embodiments, an etching process is performed to remove a portion of the annular semiconductor fin 111 exposed by the aperture 151, and the etching process also removes an exposed portion of the inner gate structure 130B and the outer gate structure 130A.

In some embodiments, the etching process is performed through the aperture 151 to form a recess 153 down to the bottom insulating spacers 121. In some embodiments, the recess 153 divides the annular semiconductor fin 111 into a first curved semiconductor fin 111-1 and a second curved semiconductor fin 111-2, and the first curved semiconductor fin 111-1 and the second curved semiconductor fin 111-2 are disposed with an annular shape, as shown in FIG. 21. In some embodiments, the recess 153 also divides the inner gate structure 130B into a first inner curved gate structure 130B-1 and a second inner curved gate structure 130B-2. In some embodiments, the recess 153 also divides the outer gate structure 130A into a first curved outer gate structure 130A-1 and a second curved outer gate structure 130A-2.

Figure 26:
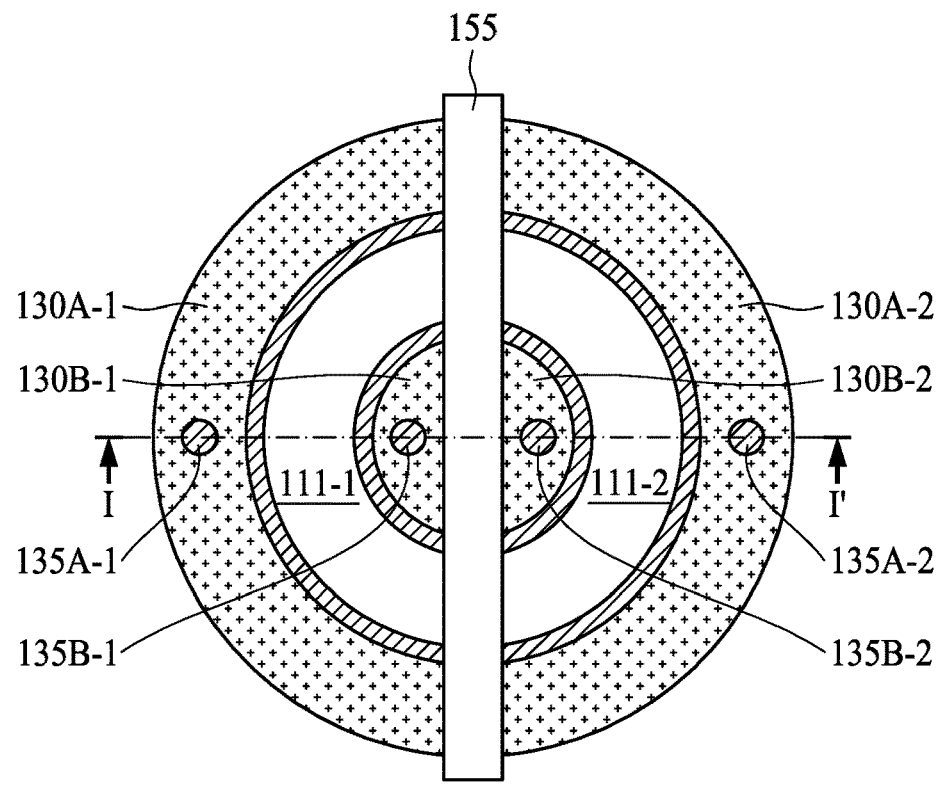
FIGS. 26 and 27 are a top view and a schematic cross-sectional side view of the semiconductor device structure of FIG. 25 after forming a dielectric block by filling the recess with a dielectric material, in accordance with some embodiments.
Figure 27:
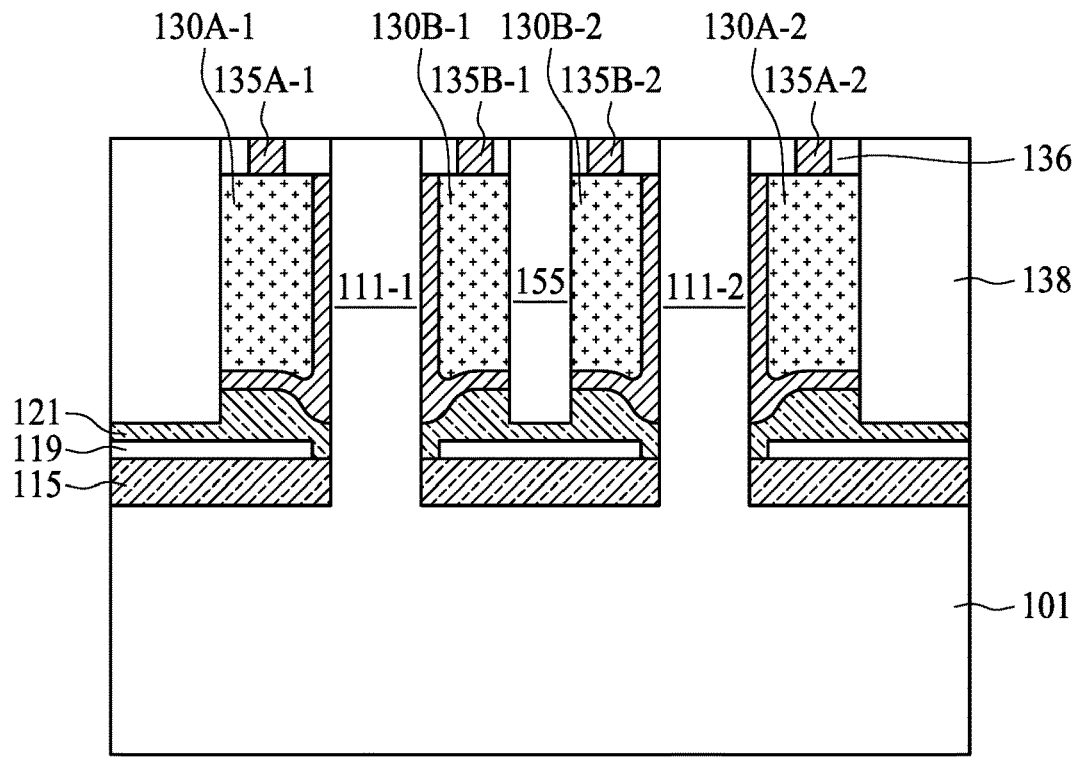

FIGS. 26 and 27 are a top view and a schematic cross-sectional side view of the semiconductor device structure of FIG. 22 after forming a dielectric block 155 by filling the recess 153 with a dielectric material, a first outer gate contact 135A-1 connecting to the gate of the first curved outer gate structure 130A-1, a second outer gate contact 135A-2 connecting to the second curved outer gate structure 130A-2, a first inner gate contact 135B-1 connecting to the gate of the first curved inner gate structure 130B-1, and a second inner gate contact 135B-2 connecting to the second curved inner gate structure 130B-2.

In some embodiments, the dielectric block 155 electrically separates the first curved semiconductor fin 111-1 from the second curved semiconductor fin 111-2. In some embodiments, the dielectric block 155 electrically separates the first inner curved gate structure 130B-1 from the second inner curved gate structure 130B-2. In some embodiments, the dielectric block 155 electrically separates the first curved outer gate structure 130A-1 from the second curved outer gate structure 130A-2. In some embodiments, the annular semiconductor fin (or annular gate structure) may be divided into several curved semiconductor fins (curved gate structures) by changing the layout of the recess 153 (or the dielectric block 155). For example, a triangular recess (or dielectric block) divides the annular semiconductor fin (or annular gate structure) into three curved semiconductor fins, a crisscross recess (or dielectric block) divides the annular semiconductor fin 111 into four curved semiconductor fins (or curved gate structures), and so on.

In some embodiments of the present disclosure, a method for preparing a semiconductor device structure is provided. The method includes forming a ring structure over a substrate; performing an etching process to form an annular semiconductor fin under the ring structure; forming a lower source/drain region on the surface of the substrate in contact with a bottom portion of the annular semiconductor fin; forming an inner gate structure in contact with an inner sidewall of the annular semiconductor fin and forming an outer gate structure in contact with an outer sidewall of the annular semiconductor fin; and forming an upper source/drain region on an upper portion of the annular semiconductor fin.

In another embodiment of the present disclosure, a semiconductor device structure is provided. The semiconductor device structure includes: a substrate; an annular fin disposed over the substrate; a lower source/drain region disposed on a surface of the substrate and in contact with a bottom portion of the annular fin; an inner gate structure in contact with an inner sidewall of the annular fin and an outer gate structure in contact with an outer sidewall of the annular fin; and an upper source/drain region disposed on an upper portion of the annular fin.

In some embodiments of the present disclosure, a semiconductor device structure is provided. The semiconductor device structure includes: a substrate; a plurality of curved fins disposed over the substrate; a lower source/drain region disposed on a surface of the substrate and in contact with a bottom portion of the curved fins; an inner gate structure in contact with an inner sidewall of the curved fins and an outer gate structure in contact with an outer sidewall of the curved fins; and an upper source/drain region disposed on an upper portion of the curved fins.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device structure, comprising:
    forming a ring structure over a substrate;
    performing an etching process to form an annular semiconductor fin under the ring structure; forming a processed area on a top portion of the substrate exposed by the annular semiconductor fin; and
    selectively forming a spacer on a side surface of the annular semiconductor fin;
    forming a lower source/drain region on the surface of the substrate in contact with a bottom portion of the annular semiconductor fin;
    forming an inner gate structure in contact with an inner sidewall of the annular semiconductor fin and forming an outer gate structure in contact with an outer sidewall of the annular semiconductor fin; and
    forming an upper source/drain region on an upper portion of the annular semiconductor fin.

2. The method for preparing a semiconductor device structure of claim 1, comprising:
    forming a pillar over the substrate;
    forming the ring structure surrounding the pillar, wherein a width of the pillar is greater than a width of the ring structure; and
    removing the pillar after the ring structure is formed.

3. The method for preparing a semiconductor device structure of claim 1, where in the width of the pillar is greater than about three times a width of the ring structure.

4. The method for preparing a semiconductor device structure of claim 1, further comprising:
    forming a mask layer having an aperture exposing a portion of the annular semiconductor fin; and
    performing an etching process to remove a portion of the annular semiconductor fin exposed by the aperture.

5. The method for preparing a semiconductor device structure of claim 4, wherein the aperture exposes a portion of the inner gate structure and a portion of the outer gate structure, and the etching process removes a portion of the inner gate structure and a portion of the outer gate structure.

6. The method for preparing a semiconductor device structure of claim 1, further comprising forming a sacrificial epitaxial semiconductor layer on top of the lower source/drain region, wherein the lower source/drain region is formed of a first type of epitaxial semiconductor material, and the sacrificial epitaxial semiconductor layer is formed of a second type of epitaxial semiconductor material which is different from the first type of epitaxial semiconductor material.

7. The method for preparing a semiconductor device structure of claim 6, further comprising: selectively oxidizing the sacrificial epitaxial semiconductor layer to form a self-aligned bottom insulating spacer comprising an oxide layer.

8. The method for preparing a semiconductor device structure of claim 7, wherein the self-aligned bottom insulating spacer electrically insulates the gate structure from the lower source/drain region.

9. The method for preparing a semiconductor device structure of claim 1, wherein the step of forming a processed area comprises performing an ion implantation process.

10. The method for preparing a semiconductor device structure of claim 9, wherein the ion implantation damages the top portion of the substrate exposed by the annular semiconductor fin.

11. The method for preparing a semiconductor device structure of claim 1, where in the step of forming a processed area comprises performing an ion implantation process to form an inner processes area inside the annular semiconductor fin and an outer processes area outside annular semiconductor fin.

12. The method for preparing a semiconductor device structure of claim 1, where in the annular semiconductor fin comprises silicon, and the step of forming the spacer comprises performing a thermal oxidation process.

13. The method for preparing a semiconductor device structure of claim 1, wherein the annular semiconductor fin comprises silicon, and the step of forming the spacer comprises performing a thermal oxidation process to form an inner spacer on an inner side surface of the annular semiconductor fin and an outer spacer on an outer side surface of the annular semiconductor fin.

14. The method for preparing a semiconductor device structure of claim 1, further comprising: performing a recess process to remove the processed area from the top portion of the substrate.

15. The method for preparing a semiconductor device structure of claim 14, wherein the recess process is performed using a directional anisotropic dry etch process, which is configured to vertically etch the processed area.

* * * * *